(12) United States Patent
Ogoro

(10) Patent No.: US 6,329,886 B1
(45) Date of Patent: Dec. 11, 2001

(54) IMPEDANCE-MATCHING METHOD AND CIRCUIT AT DIFFERENT FREQUENCIES

(75) Inventor: Kazuo Ogoro, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/309,312

(22) Filed: May 11, 1999

(30) Foreign Application Priority Data

Dec. 5, 1998 (JP) .................................................. 10-129075

(51) Int. Cl.$^7$ ...................................................... H03H 7/38
(52) U.S. Cl. .................................................. 333/32; 333/33
(58) Field of Search .............................. 333/32, 33, 17.3, 333/132, 126, 129

(56) References Cited

U.S. PATENT DOCUMENTS

| | | | |
|---|---|---|---|
| 4,558,285 | * 12/1985 | Shrestha et al. | 330/53 |
| 5,061,913 | * 10/1991 | Okochi et al. | 333/181 |
| 5,258,728 | * 11/1993 | Taniyoshi et al. | 333/132 |
| 5,281,932 | * 1/1994 | Even-Or | 333/32 |
| 5,999,134 | * 12/1999 | Dishart et al. | 343/713 |

FOREIGN PATENT DOCUMENTS

| | | |
|---|---|---|
| 43 12 259 A1 | 10/1994 | (DE) . |
| 0 613 209 A1 | 8/1994 | (EP) . |
| 54-183246 | 6/1953 | (JP) . |
| 60-41806 | 3/1985 | (JP) . |
| 2-44412 | 2/1990 | (JP) . |
| 3-101305 | 4/1991 | (JP) . |
| 5-206888 | 8/1993 | (JP) . |
| 5-251964 | 9/1993 | (JP) . |
| 6-525791 | 9/1994 | (JP) . |
| 7-154107 | 6/1995 | (JP) . |
| 7-221529 | 8/1995 | (JP) . |
| 9-64601 | 3/1997 | (JP) . |
| 9-139618 | 5/1997 | (JP) . |
| 9-326648 | 12/1997 | (JP) . |
| 10-56339 | 2/1998 | (JP) . |
| 10-242776 | 9/1998 | (JP) . |
| 11-502386 | 2/1999 | (JP) . |
| 11-55002 | 2/1999 | (JP) . |
| 11-88217 | 3/1999 | (JP) . |
| 11-205183 | 7/1999 | (JP) . |

OTHER PUBLICATIONS

Japanese Office Action, dated Apr. 25, 2001, with English language translation of Japanese Examiner's comments.
"Transmission Circuit Network and Filter", Ginsaku Yazaki, Mikichiyo, IECE, Jan. 20, 1977, pp. 26–31.

* cited by examiner

*Primary Examiner*—Robert Pascal
*Assistant Examiner*—Kimberly E Glenn
(74) *Attorney, Agent, or Firm*—McGuireWoods LLP

(57) ABSTRACT

An impedance-matching method for matching impedances of first and second circuits at two or more frequencies by using an impedance-matching circuit including reactance elements is provided, which makes it possible to set the impedance of two circuits to be connected at an optimum value or values at the frequencies. In the first step, reactance circuits equivalent to the individual reactance elements of the impedance-matching circuit are configured. Each of the reactance circuits comprises reactance elements and has a frequency characteristic giving desired reactance values at the two or more frequencies. In the second step, reactance values of the reactance elements forming each of the reactance circuits configured in the first step are calculated. In the third step, impedance values of the impedance-matching circuit at the two or more frequencies are determined by using the reactance circuits having the calculated reactance values in the second step, thereby equalizing the impedances of the first and second circuits to their optimum value or value. Each of the reactance circuits comprises a parallel or series resonant circuit having a resonant frequency located between two adjacent ones of the frequencies.

33 Claims, 31 Drawing Sheets

IMPEDANCE-MATCHING METHOD AND CIRCUIT AT DIFFERENT FREQUENCIES

BACKGROUND OF THE INVENTION

1. Field of the Invention

The present invention relates to an impedance-matching method and an impedance-matching circuit and more particularly, to an impedance-matching method and an impedance-matching circuit capable of matching the impedance between two circuits at different frequencies, which are suitably used for wireless communication systems using radio frequency (RF) signals.

2. Description of the Prior Art

Conventionally, impedance matching circuits have been used to maximize the performance of electronic devices used in RF circuits of wireless communication systems. FIG. 1 is a schematic circuit diagram showing an application example of conventional impedance-matching circuits.

In FIG. 1, first and second impedance-matching circuits 110 and 120 are connected to input and output terminals 132 and 133 of a RF circuit 140, respectively. The first impedance-matching circuit 110 serves to match or accord the output impedance of a RD circuit (not shown) located at a prior stage to the circuit 140 with the input impedance of the RF circuit 140. The second impedance-matching circuit 120 serves to match the output impedance of the RF circuit 140 with the input impedance of an RF circuit (not shown) located at a next stage to the circuit 140.

For the sake of simplification, the RF circuit 140 is illustrated as a RF amplifier equipped with only one npn-type bipolar transistor Tr in FIG. 1, which is an alternate-current (ac) equivalent circuit. The transistor Tr has an emitter connected to the ground, a base connected to the input terminal 132, and a collector connected to the output terminal 133.

The first impedance-matching circuit 110 is comprised of two coils or inductors 111 and 112. Two terminals of the inductor 111 are connected to the terminals 131 and 132, respectively. Two terminals of the inductor 112 are connected to the terminal 131 and the ground, respectively. The circuit 110 has a so-called "L—L matching" configuration. The second impedance-matching circuit 120 is comprised of two capacitors 121 and 122. Two terminals of the capacitor 121 are connected to the terminals 133 and 134, respectively. Two terminals of the capacitor 122 are connected to the terminal 134 and the ground, respectively. The circuit 120 has a so-called "C—C matching" configuration.

The first impedance-matching circuit 110, which serves to match the output impedance of the prior-stage RF circuit with the input impedance of the RF circuit 140, has a problem that impedance matching is realized only at single frequency. Thus, to realize impedance matching at different frequencies between the RF circuit 140 and its preceding-stage circuit, some contrivance is needed. This is applied to the second impedance-matching circuit 120 also.

An example of the contrivance is explained below with reference to FIG 2, which shows a schematic circuit configuration of a single superheterodyne receiver of a portable phone of the Personal Digital Cellular (PDC) type that has been used in Japan.

In the receiver circuit of FIG. 2, an antenna 101 receives a RF signal in the 820 MHz band of frequencies. A RF amplifier 102 amplifies the RF signal received by the antenna 101 to produce an amplified RF signal. A frequency mixer 103 frequency-mixes the amplified RF signal from the RF amplifier 102 with a local signal of 950 MHz sent from a local oscillator 104, producing an intermediate Frequency (IF) signal of an IF frequency 130 MHz which is equal to the difference between the two frequencies of 950 MHz and 820 MHz. An IF amplifier 105 amplifies the IF signal from the frequency mixer 103 to produce an amplified IF signal. A demodulator 106 demodulates the amplified IF signal from the IF amplifier 105 according to the specified demodulation method, thereby deriving the transmitted information from the amplified IF signal.

In the circuit of FIG. 2, if two adjacent ones of the RF circuits handling the RF signal, such as the RF amplifier 102, the frequency mixer 103, the local oscillator 104, and the IF amplifier 105, are connected to each other through the conventional impedance matching circuit 110 or 120 shown in FIG. 1, the configuration of the impedance matching circuit 110 or 120 is designed in such a way that the impedances of the two RF circuits to be connected are matched with each other at a specific single frequency (e.g., 820 MHz) within the frequency band (i.e., the 820 MHz band) of the received signal. In this case, the RF amplifier 102 has a frequency response or characteristic of the Voltage Standing-Wave Ratio (VSWR) shown in FIG. 5, where f is the frequency of the received signal. In other words, since the necessary band of frequencies is only the 820 MHz band, the configuration of the impedance matching circuit 110 or 120 is designed so that the output impedance of one of the RF circuits to be connected is equal to the input impedance of the other at a frequency of 180 MHz.

In recent years, however, technological advances have been rapidly accomplished in the radio communication equipment and systems and as a result, there has been the need to enable RF receivers to handle the RF signals within two separated bands of frequencies. An example of the RF receivers coping with this need is a telephone capable of handling the RF signal in the 820 MHz band used for the PDC-type portable phone system and that of the 1.9 GHz (i.e., 1900 MHz) band used for the Personal Handy-phone System (PHS). Two examples of the conventional circuit configurations of this two-band telephone is shown in FIGS. 3 and 4.

In the circuit configuration of FIG. 3, there are provided with a circuit block for handling the received signal in the 820 MHz band comprising a RF amplifier 102a, a frequency mixer 103a, a local oscillator 104a, and an IF amplifier 105a, and a circuit block for handling the received signal in the 1900 MHz band comprising a RF amplifier 102b, a frequency mixer 103b, a local oscillator 104b, and an IF amplifier 105b. The two circuit blocks for the 820 MHz and 1900 MHz bands are alternatively used by switches 107 and 108. The local oscillators 104a and 104b generate local signals having local frequencies of 950 and 1770 MHz, respectively.

In the circuit configuration of FIG. 3, each of the RF amplifiers 102a and 102b provides the VSWR-f characteristic shown in FIG. 6A. Specifically, impedance matching is carried out only at a specific frequency (e.g., 820 MHz) within the 820 MHz band with respect to the circuit block for the 820 MHz band. Simultaneously with this, impedance matching is carried out only at a specific frequency (e.g., 1900 MHz) within the 1900 MHz band with respect to the circuit block for the 1900 MHz band.

Since the two circuit blocks for the 820 MHz and the 1900 MHz bands are alternatively used by the switches 107 and 108 according to the frequency band of the received signal, the VSWR-f characteristic of each of the RF amplifiers 102a and 102b is given by the curve shown in FIG. 6B produced by combining the two curves in FIG. 6A with each other.

In the circuit configuration of FIG. 4, which is a variation of the configuration of FIG. 3, there are provided with a common frequency mixer 103 and a common IF amplifier 105 for handling the received signals in the 820 and 1900 MHz bands instead of the dedicated local oscillators 104a and 104b and the dedicated frequency mixers 105a and 105b in FIG. 3 Also, according to this difference, a switch 109 for selecting one of the outputs of the RF amplifiers 102a and 102b and a switch 110 for selecting one of the outputs of the local oscillators 104a and 104b provided instead of the switch 108 in FIG. 3. The other part of the circuit configuration of FIG. 4 is the same as that of FIG. 3. In this case, similar to the configuration of FIG. 3, each of the RF amplifiers 102a and 102b provides the VSWR-f characteristic shown in FIG. 6B.

With the circuit configurations shown in FIGS. 3 and 4, however, switching means (i.e., the switches 107, 108, 109, and 110) are necessarily provided. Thus, there is a problem that possible electric-power loss of the telephone due to the switching means is larger than the circuit configuration of FIG. 2 designed for a single band of frequencies. Moreover, two dedicated circuit blocks need to be provided for the 820 and 1900 MHz bands and therefore, there is another problem that the circuit configuration of the telephone is more complicated than that of FIG. 2.

Accordingly, to solve the above-described problems in the circuit configurations of FIGS. 3 and 4, a design to lower the Q value of the impedance matching circuit 110 or 120 thereby realizing approximate impedance-matching within a frequency range covering both the 820 and 1900 MHz bands may be used in the circuit configuration of FIG. 2. In this case, the VSWR-f characteristic of the RF amplifier 102 is given by the curve shown in FIG. 7. Although the VSWR-f characteristic of FIG. 7 is unable to provide complete impedance-matching (i.e., matching at optimum impedance values) in the whole frequency range covering both the 820 and 1900 MHz bands, it enables the single-band circuit of FIG. 2 to realize approximate impedance-matching within the same frequency range.

However, the design to utilize the VSWR-f characteristic of FIG. 7 has the following problems.

A first one of the problems is that the impedance is unable to be set at an optimum value for each of the 820 and 1900 MHz bands, which is due to the following reason. Specifically, in general, the impedance matching circuit 110 or 120 is configured so that the impedance is completely matched at a medium frequency of 1360 MHz between the values of 820 MHz and 1900 MHz, thereby equalizing the impedance-matching level in the 820 and 1900 MHz bands.

A second one of the problems is that the signal-receiving performance cannot be optimized compared with single-band configuration using the VSWR-f characteristic of FIG. 5, resulting in increase in possible electric-power loss of the receiver circuit. This problem is caused by the intentionally-decreased Q value of the impedance matching circuit 110 or 120 and by the increased electric-power loss of the circuit 110 or 120 due to decrease of the Q value.

As described above, with the conventional impedance matching circuit 110 or 120 shown in FIG. 1, it is obvious that the impedance of each of two RF circuits to be connected is unable to be set at optimum values at two separate frequencies. Also, the electric-power loss is increased due to impedance matching.

SUMMARY OF THE INVENTION

Accordingly, an object of the present invention to provide an impedance-matching method and an impedance-matching circuit that make it possible to set the impedance of two circuits to be connected at an optimum value or values at two or more separate frequencies.

Another object of the present invention to provide an impedance-matching method and an impedance-matching circuit that simplify the circuit configuration of a system capable of handling signals in two or more bands of frequencies.

Still another object of the present invention to provide an impedance-matching method and an impedance-matching circuit that prevents the electric-power loss due to impedance matching from being increased.

The above objects together with others not specifically mentioned will become clear to those skilled in the art fro the following description.

According to a first aspect of the present invention, an impedance-matching method for matching impedances of first and second circuits at two or more frequencies by using an impedance-matching circuit including reactance elements is provided, which is comprised of the following first to third steps.

In the first step, reactance circuits equivalent to the individual reactance elements of the impedance-matching circuit are configured. Each of the reactance circuits comprises reactance elements and has a frequency characteristic giving desired reactance values at the two or more frequencies.

In the second step, reactance values of the reactance elements forming each of the reactance circuits configured in the first step are calculated.

In the third step, impedance values of the impedance-matching circuit at the two or more frequencies are determined by using the reactance circuits having the calculated reactance values in the second step, thereby equalizing the impedances of the first and second circuits to their optimum value or values.

With the impedance-matching method according to the first aspect of the present invention, the reactance circuits equivalent to the individual reactance elements of the impedance-matching circuit are configured in the first step, where each of the reactance circuits comprises reactance elements and has a frequency characteristic giving desired reactance values at the two or more frequencies. Then, in the second step, the reactance values of the reactance elements forming each of the reactance circuits configured in the first step are calculated. Finally, in the third step, the impedance values of the impedance-matching circuit at the two or more frequencies are determined by using the reactance circuits having the calculated reactance values in the second step, thereby equalizing the impedances of the first and second circuits to their optimum value or values.

As a result, the impedances of the first and second circuits to be connected can be set at their optimum value or values at the two or more frequencies. This simplifies the circuit configuration of a system capable of handling signals in two or more separate frequency bands and at the same time, this prevents the electric-power loss due to impedance matching from being increased.

In a preferred embodiment of the method according to the first aspect, each of the reactance circuits configured in the first step comprises a resonant circuit having a resonant frequency located between two adjacent ones of the frequencies.

In another preferred embodiment of the method according to the first aspect, the resonant circuit is a parallel resonant circuit formed by reactance elements. In this case, it is preferred that the parallel resonant circuit is formed by an inductive reactance element and a capacitive reactance element connected in parallel.

In still another preferred embodiment of the method according to the first aspect, the resonant circuit is a series resonant circuit formed by reactance elements. In this case, it is preferred that the series resonant circuit is formed by an inductive reactance element and a capacitive reactance element connected in series.

In a further preferred embodiment of the method according to the first aspect, the calculation of the reactance values of the reactance elements in the second step is performed using a Smith or admittance chart on which a target point corresponding to the impedance value of the second circuit at one of the frequencies is located a center of the chart. Further, the following three substeps are carried out using the chart.

In the first substep, initial points corresponding to the impedance values of the first circuit at the respective frequencies are defined on the chart.

In the second substep, the initial points defined on the chart are moved to corresponding temporary points on a circular circumference passing through the center of the chart.

In the third substep, the temporary points located on the circular circumference are moved to overlap with the center of the chart.

According to a second aspect of the present invention, an impedance-matching circuit used for matching impedances of first and second circuits at two or more frequencies is provided.

This impedance-matching circuit is comprised of first terminal pair across which the first circuit is connected, a second terminal pair across which the second circuit is connected, and impedance circuits provided between the first terminal pair and the second terminal pair.

Each of the impedance circuits including a reactance circuit with a frequency characteristic giving desired reactance values at the two or more frequencies. Impedance values of each of the impedance circuits at the frequencies are determined by the corresponding reactance circuit.

Total impedance values of the impedance circuits at the frequencies are defined to equalize the impedances of the first and second circuits to their optimum value or values.

With the impedance-matching circuit according to the second aspect of the present invention, because of substantially the same reason as described in the method according to the first aspect of the present invention, the impedances of the first and second circuits to be connected can be set at their optimum values at the two or more frequencies. This simplifies the circuit configuration of a system capable of handling signals in two or more separate frequency bands and at the same time, this prevents the electric-power loss due to impedance matching from being increased.

In a preferred embodiment of the circuit according to the second aspect, each of the reactance circuits comprises a resonant circuit having a resonant frequency located between two adjacent ones of the frequencies.

In another preferred embodiment of the circuit according to the second aspect, each of the resonant circuits is a parallel resonant circuit formed by reactance elements. In this case, it is preferred that each of the parallel resonant circuit includes an inductive reactance element and a capacitive reactance element connected in parallel. At least one of an inductive reactance element and a capacitive reactance element may be further connected in series to the parallel resonant circuit in each of the reactance circuits.

In still another preferred embodiment of the circuit according to the second aspect, each of the reactance circuits comprises resonant circuits connected in series. Each of the resonant circuits has a resonant frequency located between two adjacent ones of the frequencies. In this case, it is preferred that each of the resonant circuits is a parallel resonant circuit formed by an inductive reactance element and a capacitive reactance element connected in parallel. At least one of an inductive reactance element and a capacitive reactance element may be further connected in series to the parallel resonant circuits in each of the reactance circuits.

In a further preferred embodiment of the circuit according to the second aspect, each of the resonant circuits is a series resonant circuit formed by reactance elements. In this case, it is preferred that each of the series resonant circuit includes an inductive reactance element and a capacitive reactance element connected in series. At least one of an inductive reactance element and a capacitive reactance element may be further connected in parallel to the series resonant circuit in each of the reactance circuits.

IN a still further preferred embodiment of the circuit according to the second aspect, each of the reactance circuits comprises resonant circuits connected in parallel. Each of the resonant circuits has a resonant frequency located between two adjacent ones of the frequencies. In this case, it is preferred that each of the resonant circuits is a series resonant circuit formed by an inductive reactance element and a capacitive reactance element connected in series. At least one of an inductive reactance element and a capacitive reactance element may be further connected in parallel to the series resonant circuits in each of the reactance circuits.

In the impedance-matching circuit according to the second aspect, preferably, the impedance circuits have the following connection manners (a) to (f).

(a) A first one of the impedance circuits is connected to one terminal of the first terminal pair and one terminal of the second terminal pair, and a second one of the impedance circuits is connected across the first or second terminal pair.

(b) A first one of the impedance circuits is connected to one terminal of the first terminal pair and one terminal of the second terminal pair, and second and third ones of the impedance circuits are respectively connected across the first and second terminal pairs.

(c) A first one of the impedance circuits is connected to one terminal of the first terminal pair and one terminal of the second terminal pair, a second one of the impedance circuits is connected to the other terminal of the first terminal pair and the other terminal of the second terminal pair, and a third one of the impedance circuits is connected across the first or second terminal pair.

(d) A first one of the impedance circuits is connected to one terminal of the first terminal pair and one terminal of the second terminal pair, a second one of the impedance circuits is connected to the other terminal of the first terminal pair and the other terminal of the second terminal pair, and third and fourth ones of the impedance circuits are respectively connected across the first and second terminal pairs.

(e) First and second ones of the impedance circuits are connected in series between one terminal of the first terminal pair and one terminal of the second terminal pair, and a third one of the impedance circuits is connected to the connection point of the first and second ones of the impedance circuits and the other terminals of the first and second terminal pairs.

(f) First and second ones of the impedance circuits are connected in series between one terminal of the first terminal pair and one terminal of the second terminal pair, third and fourth ones of the impedance circuits are connected in series between the other terminal of the first terminal pair and the other terminal of the second terminal pair, and a fifth one of the impedance circuits is connected to the connection point of the first and second ones of the impedance circuits and that of the third and fourth ones of the impedance circuits.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
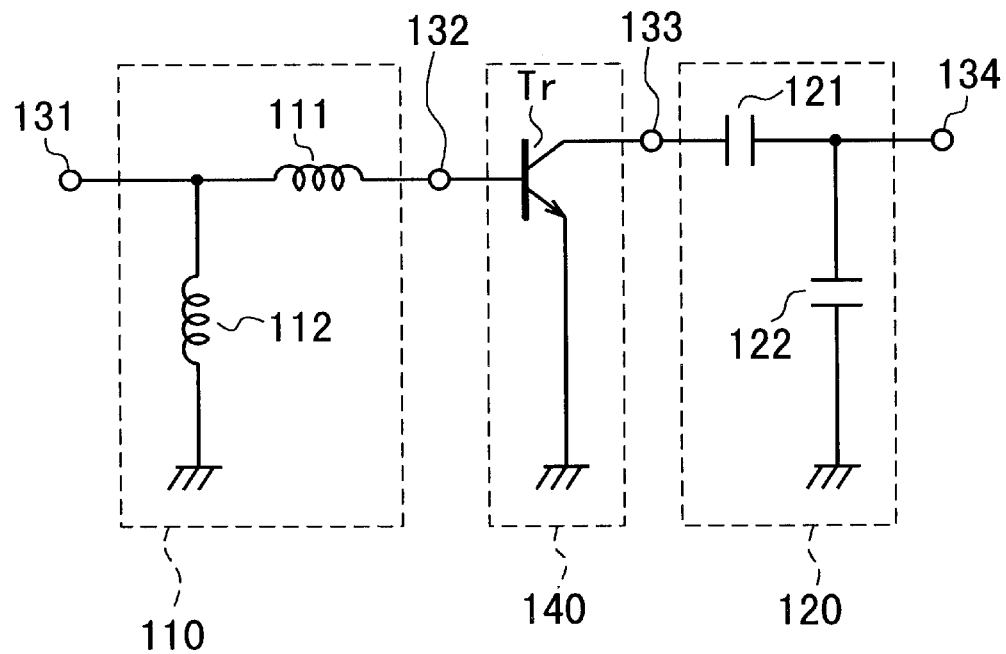
FIG. 1 is a circuit diagram showing the configuration and connection of conventional impedance-matching circuits.
Figure 2:
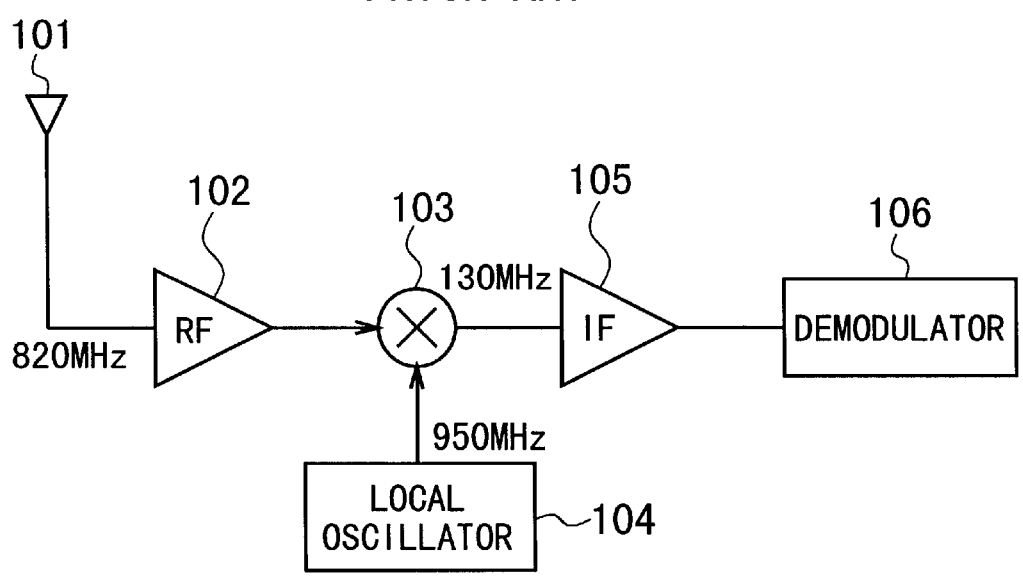
FIG. 2 is a block diagram showing the circuit configuration of a conventional single superheterodyne receiver of a PDC-type portable phone.

Preferred embodiments of the present invention will be described in detail below while referring to the drawings attached.

First Embodiment

Figure 8A:
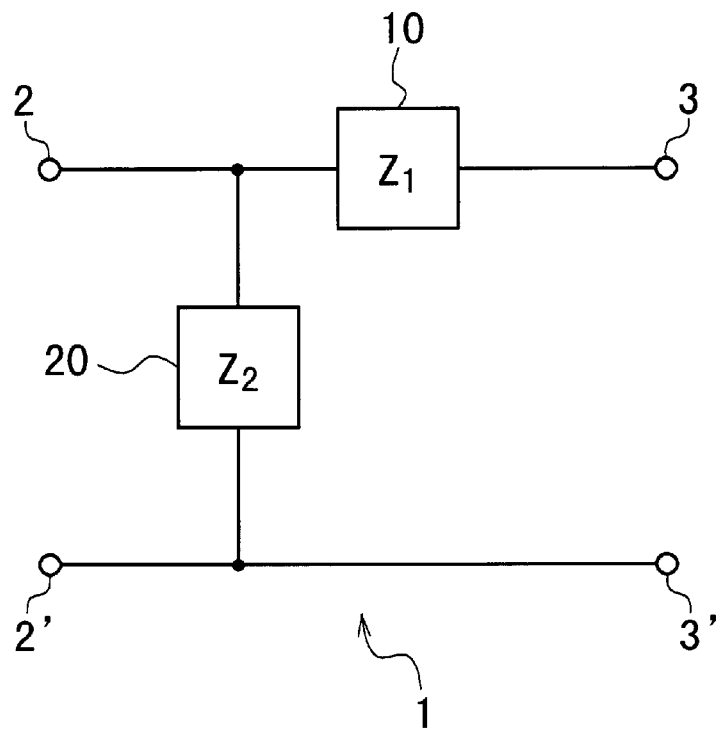
FIG. 8A is a block diagram showing the basic configuration of an impedance-matching circuit according to a first embodiment of the present invention, in which two impedance elements are provided.

An impedance-matching circuit according to a first embodiment of the present invention has a basic configuration shown in FIG. 8A. This impedance-matching circuit 1 is comprised of a first impedance circuit 10 having an impedance $Z_1$ and a second impedance circuit 20 having an impedance $Z_2$. Two terminals of the first impedance circuit 10 are connected to an input terminal 2 and an output terminal 3, respectively. One terminal of the second impedance circuit 20 is connected to the terminal 2 and the other terminal of the circuit 20 is connected in common to an input terminal 2' and an output terminal 3'. The input terminals 2 and 2' form an input terminal pair of the impedance-matching circuit 1. The output terminals 3 and 3' form an output terminal pair of the impedance-matching circuit 1.

The impedance-matching circuit 1 serves to match the input impedance of a RF circuit (not shown) connected across the output terminals 3 and 3' with the output impedance of another RF circuit (not shown) connected across the input terminals 2 and 2'. This impedance matching is carried out at separated frequencies.

Figure 8B:
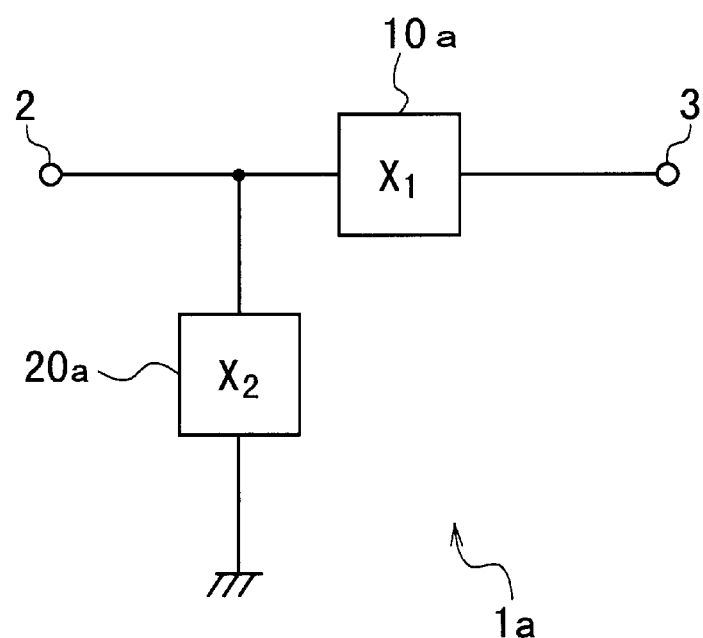
FIG. 8B is a block diagram showing the simplified basic configuration of the impedance-matching circuit according to the first embodiment of the present invention, in which two reactance elements are provided.

An impedance-matching circuit 1a shown in FIG. 8B corresponds to one obtained by replacing respectively the first and second impedance circuits 10 and 20 with first and second reactance circuits 10a and 20a and by connecting the commonly-connected terminals 2' and 3' to the ground. The first and second impedance circuits 10 and 20 have reactances $X_1$ and $X_2$, respectively. In other words, the impedance-matching circuit 1a shown in FIG. 8B corresponds to the case where each of the first and second impedance circuits 10 and 20 does not have any resistance (i.e., the real part of the impedance) but have reactances (i.e., the imaginary part of the impedance) in the impedance-matching circuit 1 shown in FIG. 8A.

Thus, for the sake of simplification of description, the impedance-matching circuit 1a of FIG. 8B having a simplified configuration of the circuit 1 of FIG. 8A will be explained below. This is because the configuration and the operation of the impedance=matching circuit 1a can be easily applied or expanded to the impedance-matching circuit 1.

As seen from FIG. 8B, in the impedance-matching circuit 1a, two terminals of the first reactance circuit 10a are connected to the input and output terminals 2 and 3, respectively. One terminal of the second reactance circuit 20a is connected to the input terminal 2 and the other terminal thereof is connected to the ground. An unillustrated RF circuit at a prior stage to the impedance-matching circuit 1a is connected across the input terminal 2 and the ground. Another unillustrated RF circuit at a next stage to the circuit 1a is connected across the output terminal 3 and the ground.

Next, the concrete circuit configuration of the impedance-matching circuit 1a according to the first embodiment is explained below with reference to FIG. 9.

Figure 9:
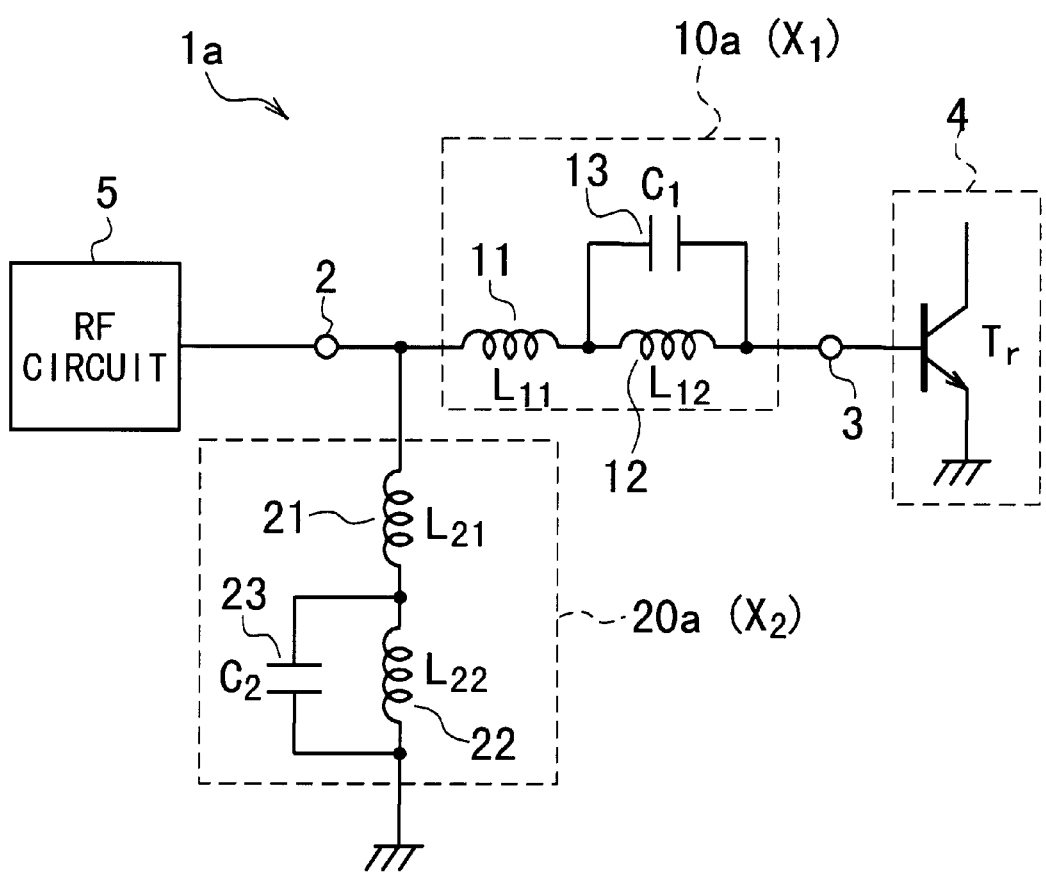
FIG. 9 is a circuit diagram showing the concrete configuration of the impedance-matching circuit according to the first embodiment of FIG. 8B.

As shown in FIG. 9, the first reactance circuit 10a is formed by three reactance elements 11, 12, and 13. The element 11 is an inductor or coil having an inductance $L_{11}$. The element 12 is an inductor having an inductance $L_{12}$. The element 13 is a capacitor having a capacitance $C_1$.

The inductor 12 and the capacitor 13 are connected in parallel. One terminal of the inductor 12 and one terminal of the capacitor 13 are connected in common to the output terminal 3 of the impedance-matching circuit 1a. The other terminal of the inductor 12 and the other terminal of the capacitor 13 are connected in common to one terminal of the inductor 11. The other terminal of the inductor 11 is connected to the input terminal 2 of the circuit 1a.

Figure 10A:
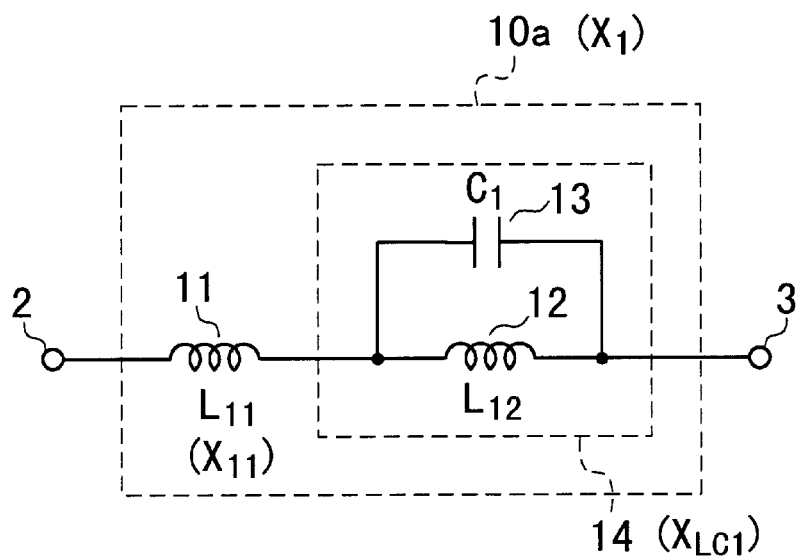
FIG. 10A is a circuit diagram of the first reactance circuit of the impedance-matching circuit according to the first embodiment of FIG. 9.

The parallel-connected inductor 12 and capacitor 13 constitute a parallel resonant circuit 14 having a resonant frequency $f_{01}$, as shown in FIG. 10A. Thus, it is said that the first reactance circuit 10a is formed by the parallel resonant circuit 14 and the inductor 11 connected in series thereto between the input and output terminals 2 and 3.

Similar to the first reactance circuit 10a, the second reactance circuit 20a is formed by three reactance elements 21, 22, and 23. The element 21 is an inductor having an inductance $L_{21}$. The element 22 is an inductor having an inductance $L_{22}$. The element 23 is a capacitor having a capacitance $C_2$.

The inductor 22 and the capacitor 23 are connected in parallel. One terminal of the inductor 22 and one terminal of the capacitor 23 are connected in common to the ground. The other terminal of the inductor 22 and the other terminal of the capacitor 23 are connected in common to one terminal of the inductor 21. The other terminal of the inductor 21 is connected to the input terminal 2 of the circuit 1a.

Figure 10B:
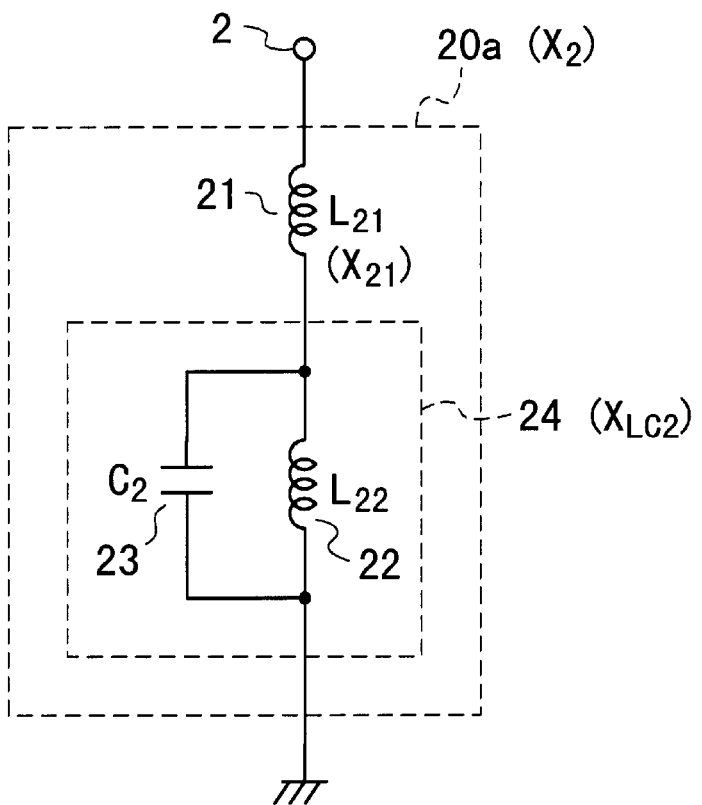
FIG. 10B is a circuit diagram of the second reactance circuit of the impedance-matching circuit according to the first embodiment of FIG. 9.

The parallel-connected inductor 22 and capacitor 23 constitute a parallel resonant circuit 24 having a resonant frequency $f_{02}$, as shown in FIG. 10B. Thus, it is said that the second reactance circuit 20a is formed by the parallel resonant circuit 24 and the inductor 21 connected in series thereto between the input terminal 2 and the ground. The resonant frequency $f_{02}$ of the circuit 24 is typically different from the resonant frequency $f_{01}$ of the parallel resonant circuit 14.

Subsequently, the operation of the above-described first and second reactance circuits 10a and 20a is explained below.

As shown in FIG. 9, a RF circuit 5 is connected across the input terminal 5 of the impedance-matching circuit 1a and the ground and at the same time, a RF circuit 4 is connected across the output terminal 3 thereof and the ground on use. This circuit 1a serves to match the input impedance of the RF circuit 4 with the output impedance of the RF circuit 5 at two desired frequencies of $f_1$ and $f_2$ ($f_1 < f_2$) due to the following reason, where $f_1 < f_{01} < f_2$ and $f_1 < f_{02} < f_2$. For example, $f_1 = 820$ MHz and $f_2 = 1900$ MHz.

First, when the signal frequency (i.e., the frequency of the electric signal sent from the RF circuit 5) is defined as f, the reactance $X_{11}$ of the inductor 11 of the first reactance circuit 10a is given by the following equation (1).

$$X_{11} = j(2\pi f)L_{11} \qquad (1)$$

Figure 11A:
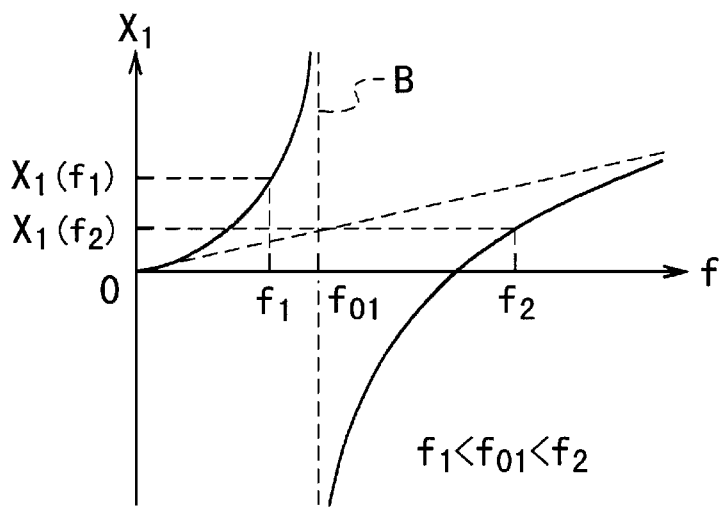
FIG. 11A is a graph showing schematically the frequency characteristic of the reactance of the first reactance circuit in the impedance-matching circuit according to the first embodiment of FIG. 9.
Figure 11B:
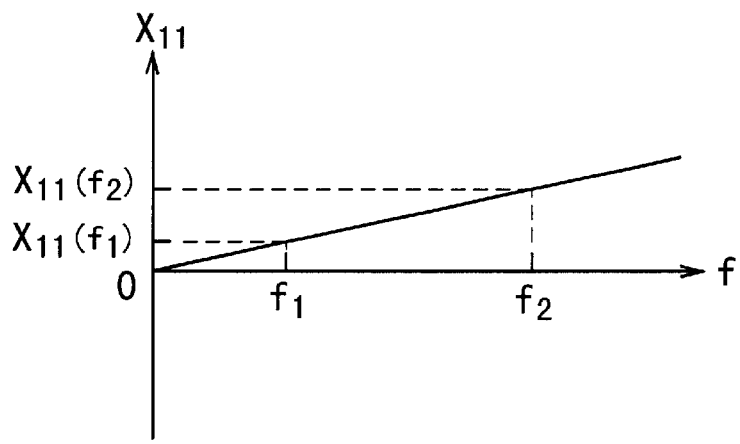
FIG. 11B is a graph showing schematically the frequency characteristic of the reactance of the inductor used in the first reactance circuit of the impedance-matching circuit according to the first embodiment.

The reactance $X_{11}$ given by the equation (1) has a frequency characteristic shown in FIG. 11B. Specifically, the frequency characteristic of the reactance $X_{11}$ is expressed by a straight line passing through the origin or the intersection of the f and $X_{11}$ axes. Thus, the reactance $X_{11}$ increases monotonously with the rising frequency f from 0 (i.e., dc).

On the other hand, the reactance $X_{LC1}$ of the parallel resonant circuit 14 is given by the following equation (2).

$$X_{LC1} = \frac{j}{\frac{1}{(2\pi f)L_{12}} - (2\pi f)C_1} \qquad (2)$$

Figure 11C:
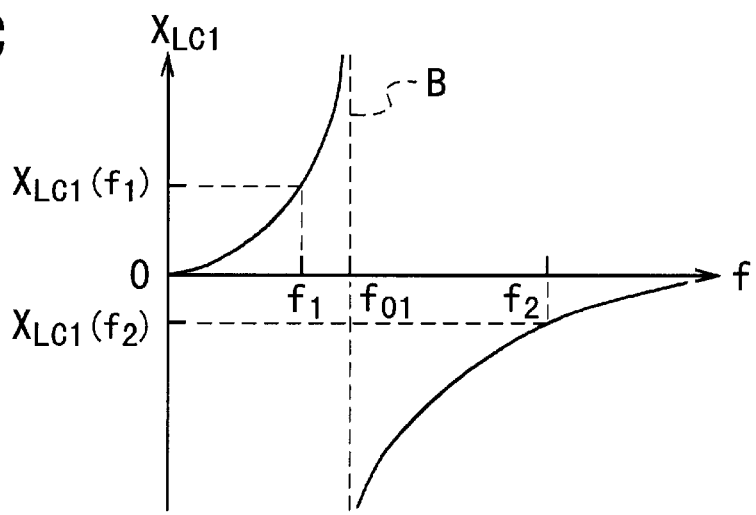
FIG. 11C is a graph showing schematically the frequency characteristic of the reactance of the parallel resonant circuit used in the first reactance circuit of the impedance-matching circuit according to the first embodiment.

The reactance $X_{LC1}$ given by equation (2) has a frequency characteristic shown in FIG. 11C. Specifically, the frequency characteristic of the reactance $Xd_{LC1}$ is expressed by curves having a vertical asymptote B located at the resonant frequency of $f_{01}$. The resonant frequency $f_{01}$ of the parallel resonant circuit 14 is expressed as $$f_{01} = \frac{1}{2\pi\sqrt{L_{12}C_1}} \qquad (3)$$

As seen from FIG. 11C, when the signal frequency f is lower than the resonant frequency $f_{01}$, the reactance $X_{LC1}$ of the parallel resonant circuit 14 increases gradually from zero as the signal frequency f is raised and then, it approaches the positive infinite (+∞) in the vicinity of $f_{01}$. When the signal frequency f is higher than the resonant frequency $f_{01}$, the reactance $X_{LC1}$ decreases gradually as the signal frequency f is lowered and then, it approaches the negative infinite (−∞) in the vicinity of $f_{01}$. On the other hand, the reactance $X_{LC1}$ converges on zero as the frequency f is further raised.

As seen from the circuit configuration of FIG. 10A, the reactance $X_1$ of the first reactance circuit 10a is equal to the sum of the reactance $X_{11}$ of the inductance 11 and the reactance $X_{LC1}$ of the parallel resonant circuit 14. Thus, the frequency characteristic of the reactance $X_1$ is given by summing or combining the frequency characteristics of the reactances $X_{11}$ and $X_{LC1}$, as shown in FIG. 11A.

As seen from FIG. 11A, the frequency characteristics of the reactance $X_1$ of the first reactance circuit 10a has a same tendency as that of the reactance $X_{LC1}$ of the parallel resonant circuit 14. Specifically, when the signal frequency f is lower than the resonant frequency $f_{01}$, the reactance $X_1$ increases gradually, from zero as the signal frequency f is raised and then, it approaches the positive infinite (+∞) in the vicinity of $f_{01}$. When the signal frequency f is higher than the resonant frequency $f_{01}$, the reactance $X_1$ decreases gradually as the signal frequency f is lowered and then, it approaches the negative infinite (−∞) in the vicinity of $f_{01}$. On the other hand, the reactance $X_1$ approaches the positive infinite as the frequency f is further raised.

Also, when the signal frequency f is higher than the resonant frequency $f_{01}$, the reactance $X_1$ may have any value from the negative infinite to the positive infinite. When the signal frequency f is lower than the resonant frequency $f_{01}$, the reactance $X_1$ may have any positive value only. On the only hand, the resonant frequency $f_{01}$ needs to be selected between the desired matching frequencies $f_1$ and $f_2$. If the value of the resonant frequency $f_{01}$ is varied under this condition of "$f_1 < f_{01} < f_2$", the vertical asymtote B (and consequently, the characteristic curves) is shifted along the f axis. Thus, by suitable setting the value of the resonant frequency $f_{01}$, the reactance $X_1$ can be set as desired values at the distant frequencies $f_1$ and $f_2$, which are independent of each other. This means that the values of the reactance $X_1$ at the distant frequencies $f_1$ and $f_2$ can be optionally adjusted.

In FIGS. 11A, 11B, and 11C, the symbols $X_{11}(f_1)$ and $X_{11}(f_2)$ denote the values of the reactance $X_{11}$ of the inductor 11 at the frequencies $f_1$ and $f_2$, respectively. The symbols $X_{LC1}(f_1)$ and $X_{LC1}(f_2)$ denote the values of the reactance $X_{LC1}$ of the parallel resonant circuit 14 at the frequencies $f_1$ and $f_2$, respectively. The symbols $X_1(f_1)$ and $X_1(f_2)$ denote the values of the reactance $X_1$ of the first reactance circuit 10a at the frequencies $f_1$ and $f_2$, respectively.

The desired values of the inductances $L_{11}$ and $L_{12}$ of the inductors 11 and 12 and the capacitance $C_1$ of the capacitor 13, which form the first reactance circuit 10a, are difficult to be analytically solved directly from the known values of the reactance $X_1$ of the circuit 10a and the frequencies $f_1$ and $f_2$. However, they can be numerically found by obtaining asymptotically the convergent values of $L_{11}$, $L_{12}$, and $C_1$ using a computer.

Additionally, as seen from the frequency characteristic in FIG. 11A, the impedance-matching circuit 1a according to the first embodiment has a limit that the value $X_1(f_1)$ of the reactance $X_1$ at the lower frequency $f_1$ is always positive while the value $X_1(f_2)$ of the reactance $X_1$ at the higher frequency $f_2$ may be positive or negative. Thus, the impedance-matching circuit 1a is unable to be applied to any case necessitating a negative value of $X_1(f_1)$. However, this limit can be removed by using one of the second to fourth embodiments of the invention explained later as at least one of the first and second reactance circuits 10a and 20a.

Next, the second reactance circuit 20a is explained below. As seen from FIG. 9, the circuit 20a has the same configuration as that of the first reactance circuit 10a. As a result, the above explanation about the first reactance circuit 10a is applied to the second reactance circuit 20a.

Specifically, the reactance $X_{21}$ of the inductor 21 of the second reactance circuit 20a is given by the following equation (4).

$$X_{21} = j(2\pi f)L_{21} \qquad (4)$$

The reactance $X_{21}$ given by equation (4) has a same frequency characteristic as shown in FIG. 11B. The frequency characteristic of the reactance $X_{21}$ is expressed by a straight line passing through the origin or the intersection of the f and $X_{21}$ axes. Thus, the reactance $X_{21}$ increases monotonously with the rising frequency f from 0.

On the other hand, the reactance $X_{LC2}$ of the parallel resonant circuit 24 is given by the following equation (5).

$$X_{LC2} = \frac{j}{\frac{1}{(2\pi f)L_{22}} - (2\pi f)C_2} \qquad (5)$$

The reactance $X_{LC2}$ given by equation (5) has a same frequency characteristic as shown in FIG. 11C. Specifically, the frequency characteristic of the reactance $X_{LC2}$ is expressed by curves having a vertical asymtote B located at the resonant frequency of $f_{02}$. The resonant frequency $f_{02}$ of the parallel resonant circuit 24 is expressed as $$f_{02} = \frac{1}{2\pi\sqrt{L_{22}C_2}} \qquad (6)$$

As seen from FIG. 11C, when the signal frequency f is lower than the resonant frequency $f_2$, the reactance $X_{LC2}$ of the parallel resonant circuit 24 increases gradually from zero as the signal frequency f is raised and then, it approaches the positive infinite in the vicinity of $f_{02}$. When the signal frequency f is higher than the resonant frequency $f_{02}$, the reactance $X_{LC2}$ decreases gradually as the signal frequency f is lowered and then, it approaches the negative infinite in the vicinity of $f_{02}$. On the other hand, the reactance $X_{LC2}$ converges on zero as the frequency f is further raised.

As seen from the circuit configuration in FIG. 10B, the reactance $X_2$ of the second reactance circuit 20a is equal to the sum of the reactance $X_{21}$ of the inductor 21 and the reactance $X_{LC2}$ of the parallel resonant circuit 24. Thus, the frequency characteristic of the reactance $X_2$ is given by summing or combining the frequency characteristics of the reactances $X_{21}$ and $X_{LC2}$, which is approximately the same as that shown in FIG. 11A.

As seen from FIG. 11A, the frequency characteristic of the reactance $X_2$ of the second reactance circuit 20a has a same tendency as that of the reactance $X_{LC2}$ of the parallel resonant circuit 24. Specifically, when the signal frequency f is lower than the resonant frequency $f_{02}$, the reactance $X_2$ increases gradually from zero as the signal frequency f is raised and then, it approaches the positive infinite in the vicinity of $f_{02}$. When the signal frequency f is higher than the resonant frequency $f_{02}$, the reactance $X_2$ decreases gradually as the signal frequency f is lowered and then, it approaches the negative infinite in the vicinity of $f_{02}$. On the other hand, the reactance $X_2$ approaches the positive infinite as the frequency f is further raised.

Also, when the signal frequency f is higher than the resonant frequency $f_{02}$, the reactance $X_2$ may have any value from the negative infinite to the positive infinite. When the signal frequency f is lower than the resonant frequency $f_{02}$, the reactance $X_2$ may have any positive value only. On the other hand, the resonant frequency $f_{02}$ needs to be selected between the desired matching frequencies $f_1$ and $f_2$. If the value of the resonant frequency $f_{02}$ is varied under this condition of "$f_1 < f_{02} < f_2$", the vertical asymptote B (and consequently, the characteristic curves) is shifted along the f axis. Thus, by suitably setting the value of the resonant frequency $f_{02}$, the reactance $X_2$ can be set as desired values at the separated frequencies $f_1$ and $f_2$, which are independent of each other. This means that the values of the reatance $X_2$ at the distant frequencies $f_1$ and $f_2$ can be optionally adjusted.

The desired values of the inductance $L_{21}$ and $L_{22}$ of the inductors 21 and 22 and the capacitance $C_2$ of the capacitor 23, which form the second reactance circuit 20a, are difficult to be analytically solved directly from the known values of the reactance $X_2$ of the circuit 20a and the frequencies $f_1$ and $f_2$. However, they can be numerically found by obtaining asymptotically the convergent values of $L_{21}$, $L_{22}$, and $C_2$ using a computer.

Additionally, as seen from the frequency characteristic in FIG. 11A, the impedance-matching circuit 1a according to the first embodiment has a limit that the value $X_2(f_1)$ of the reactance $X_2$ at the lower frequency $f_1$ is always positive while the value $X_2(f_2)$ of the reactance $X_2$ at the higher frequency $f_2$ may be positive or negative. Thus, the impedance-matching circuit 1a is unable to be applied to any case necessitating a negative value of $X_2(f_1)$. However, this limit can be removed by using one of the second to fourth embodiments of the invention explained later as at least one of the first and second reactance circuits 10a and 20a.

As described above, with the impedance-matching circuit 1a according to the first embodiment of the invention, by suitably setting respectively the values of the reactances $X_1$ and $X_2$ of the first and second reactance circuits 10a and 20a at the frequencies $f_1$ and $f_2$, the input impedance of the RF circuit 4 and the output impedance of the RF circuit 5 can be set at their optimum value or values at $f_1$ and $f_2$. This simplifies the circuit configuration of a system capable of handling signals in two separate frequency bands (e.g., 820 MHz and 1900 MHz bands).

Figure 7:
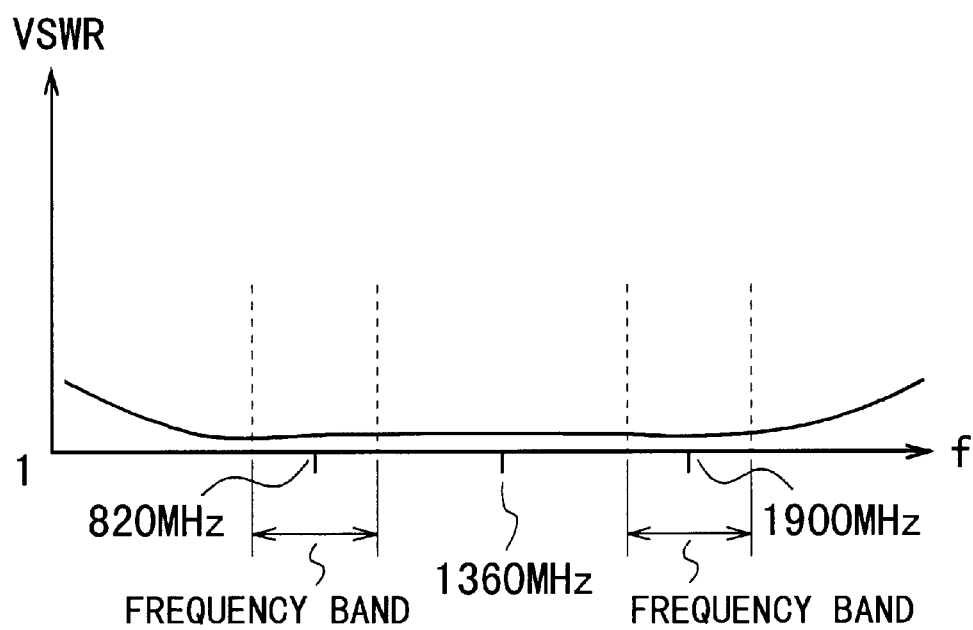
FIG. 7 is a graph showing schematically the VSWR-f characteristic of a conventional two-band telephone.

Moreover, since the input impedance of the RF circuit 4 and the output impedance of the RF circuit 5 can be set at their optimum value or values at $f_1$ and $f_2$, the Q value is unnecessary to be lowered. Thus, the electric-power loss due to the decreased Q value (see FIG. 7) does not occur, in other words, the electric-power loss caused in the impedance-matching circuit 1a is avoided. Accordingly, the electric-power loss due to impedance matching can be prevented from increasing.

Next, the operation principle to realize the complete impedance matching at $f_1$ and $f_2$ in the impedance-matching circuit 1a according to the first embodiment having the above-described configuration is explained below with reference to the Smith chart in FIG. 14.

In general, the Smith chart represents the reflection coefficient change of transmission lines on polar coordinates. Since the Smith chart allows a user to immediately read the impedance value corresponding to the reflection coefficient value out, it has been usually used for this purpose because of its convenience. Although the ordinary Smith chart has curves denoting only the impedance, the chart in FIG. 14 has curves denoting the admittance also for the sake of facilitation of understanding.

Here, it is supposed that the input impedance of the RF circuit 4 at the output terminal 3 is matched with the output impedance (=50 Ω) of the RF circuit 5 at the input terminal 2 by the impedance-matching circuit 1a.

Figure 14:
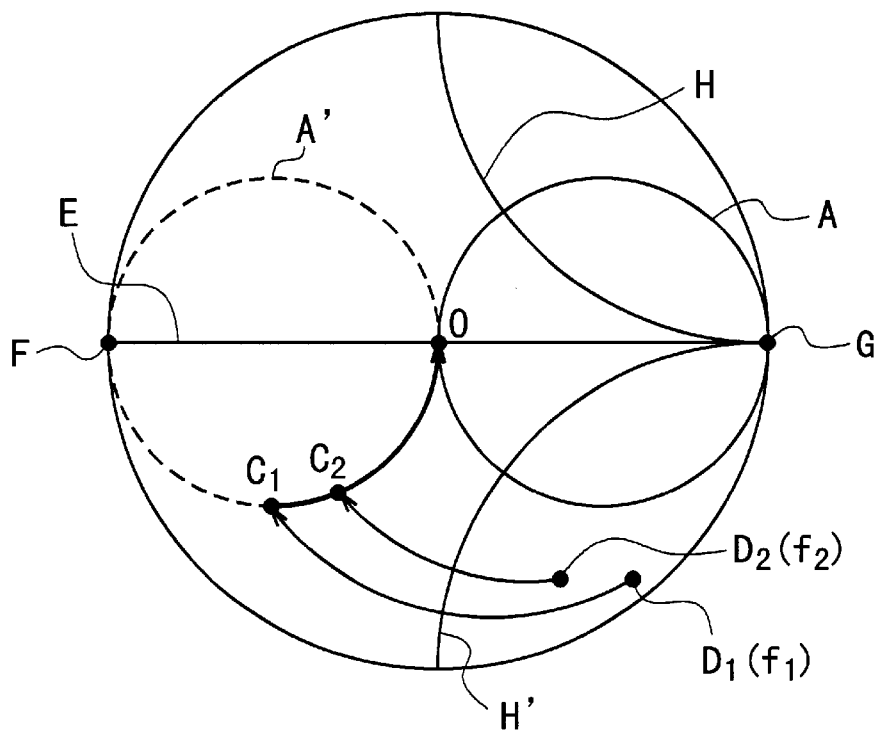
FIG. 14 is a Smith chart showing the operation of the first reactance circuit in the impedance-matching circuit according to the first embodiment.

In the Smith chart of FIG. 14, the central point O corresponds to a target impedance value of 50 Ω and the line segment E is a resistance axis. The point O is located at the middle of the line segment E. The circle A is a trajectory of points having the same impedance value of 50 Ω. The circle A' is a trajectory of points having the same admittance value of (1/50 Ω). The arc H' is a trajectory of points having the same reactance value of +50 Ω.The arc H' is a trajectory of points having the same reactance value of −50 Ω. The initial points $D_1$ and $D_2$ correspond to the values of the input impedance of the RF circuit 4 at the frequencies $f_1$ and $f_2$, respectively. The reactance values at the points $D_1$ and $D_2$ are negative.

First, the values of the reactance $X_1$ of the first reactance circuit 10a at $f_1$ and $f_2$ are suitably set, thereby moving the initial points $D_1$ and $D_2$ to the temporary points $C_1$ and $C_2$ located on the circle A', respectively. In other words, the values of the reactance $X_1$ of the first reactance circuit 10a at $f_1$ and $f_2$ have the same admittance of (1/50 Ω).

Next, the values of the reactance $X_2$ of the second reactance circuit 20a at $f_1$ and $f_2$ are suitably set, thereby moving the temporary points $C_1$ and $C_2$ along the circle A' to overlap with the central point O. In other words, while the values of the total admittance of the impedance-matching circuit 1a connected to a load at $f_1$ and $f_2$ are kept at (1/50 Ω), the reactance components of the circuit 1a is decreased to zero. Thus, the input impedance of the RF circuit 4 is matched with the output impedance (=50 Ω) of the RF circuit 5 at both the frequencies $f_1$ and $f_2$.

In contrast, such the movement of the points as shown in FIG. 14 is impossible in the conventional impedance-matching circuit 110 of FIG. 1, the reason of which is explained below with reference to FIGS. 12 and 13.

Figure 12:
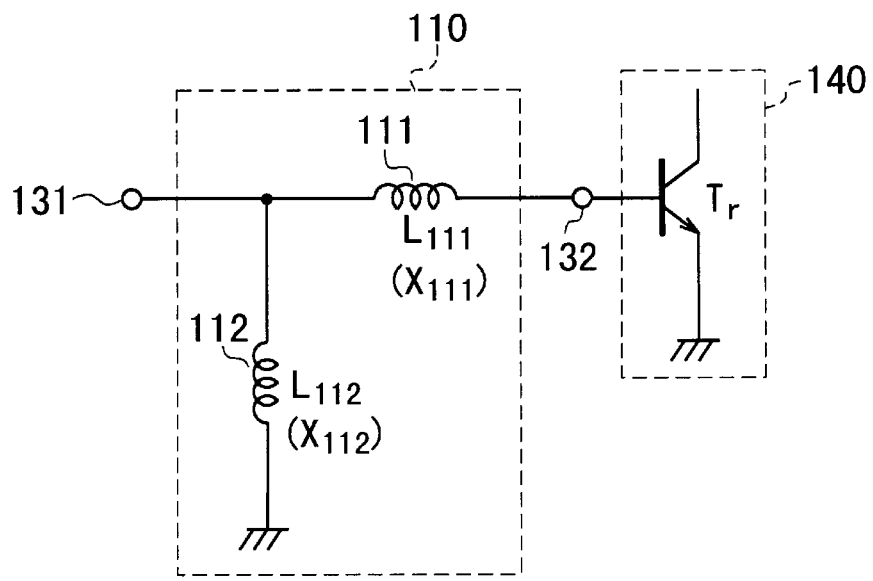
FIG. 12 is a circuit diagram of the first conventional impedance-matching circuit shown in FIG. 1.

FIG. 12 shows the conventional impedance-matching circuit 110 and the RF circuit 140 shown in FIG. 1. FIG. 13 shows a Smith chart for explaining the operation of the conventional impedance-matching circuit 110. In FIG. 12, circuits having no relationship with the impedance matching, such as a biasing circuit for the transistor Tr of the circuit 140 are omitted.

The reason why impedance matching at the two frequencies $f_1$ and $f_2$ is unable to be realized in the conventional impedance-matching circuit 110 is that the circuit 110 is formed by the inductor 111 having an inductance $L_{111}$ and the inductor 112 having an inductance $L_{112}$. In other words, each of the reactances $X_{111}$ and $X_{112}$ of the inductors 111 and 112 has a frequency characteristic given by a straight line passing through the origin O as shown in FIG. 11B, which varies monotonously with the signal frequency f. The slope angle of each line is equal to the reactance $X_{111}$ or $X_{112}$. Accordingly, the values of the reactances $X_{111}$ and $X_{112}$ are varied according to the frequency f, which are different from each other at the frequencies $f_1$ and $f_2$.

Figure 13:
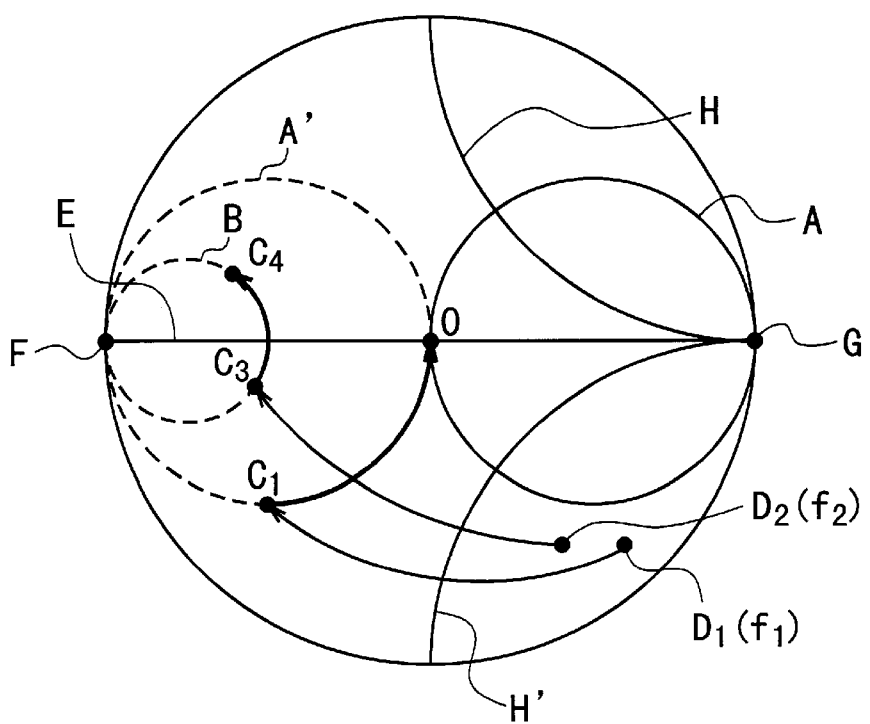
FIG. 13 is a Smith chart showing the operation of the first conventional impedance-matching circuit of FIG. 12.

As a result, in the Smith chart of FIG. 13, if the initial point $D_1$ representing the input impedance of the circuit 140 at the frequency $f_1$ is moved to the temporary point $C_1$ located on the circle A' due to the reactance $X_{111}$ of the inductor 111, the initial point $D_2$ representing the input impedance of the circuit 140 at the frequency $f_2$ is moved to the temporary point $C_3$ located on the circle B (not to the temporary point $C_2$), where the circle B penetrates through the end point F. The admittance value at the point $C_1$ is not equal to (1/50 Ω). Thus, even if the temporary point $C_1$ located on the circle A' is moved along the curve of the circle A' to the central point O due to the reactance $X_{112}$ of the inductor 112, the temporary point $C_3$ located on the circle B is moved along the curve of the circle B to the undesired point $C_4$, which means that temporary point $C_4$ is unable to be overlapped with the central point O.

Unlike the conventional impedance-matching circuit 110, the impedance-matching circuit 1a according to the first embodiment has the first and second reactance circuits 10a and 20a as shown in FIG. 9. As a result, the initial points $D_1$ and $D_2$ can be respectively moved to the temporary points $C_1$ and $C_2$ by adjusting the values of the reactance $X_1$ of the first reactance circuit 10a at $f_1$ and $f_2$ and then, the temporary points $C_1$ and $C_2$ can be respectively moved to overlap with the central point O by adjusting the values of the reactance $X_2$ of the second reactance circuit 20a at $f_1$ and $f_2$. Thus, complete impedance matching between the RF circuits 5 and 4 can be realized at both the frequencies $f_1$ and $f_2$.

Second Embodiment

FIGS. 16A to 19 show an impedance-matching circuit 1b according to a second embodiment of the present invention.

In the above-described impedance-matching circuit 1a according to the first embodiment, the initial points $D_1$ and $D_2$ are shifted in the "positive" direction on the Smith chart of FIG. 14 due to the inductors 11, 12, 21, and 22. This corresponds to the conventional impedance-matching circuit 110 having the "L—L matching" configuration, as shown in FIG. 1. In other words, the first and second reactance circuits 10a and 20a of the impedance-matching circuit 1a according to the first embodiment are equivalent to the inductors 111 and 112 of the conventional impedance-matching circuit 110, respectively.

Figure 15:
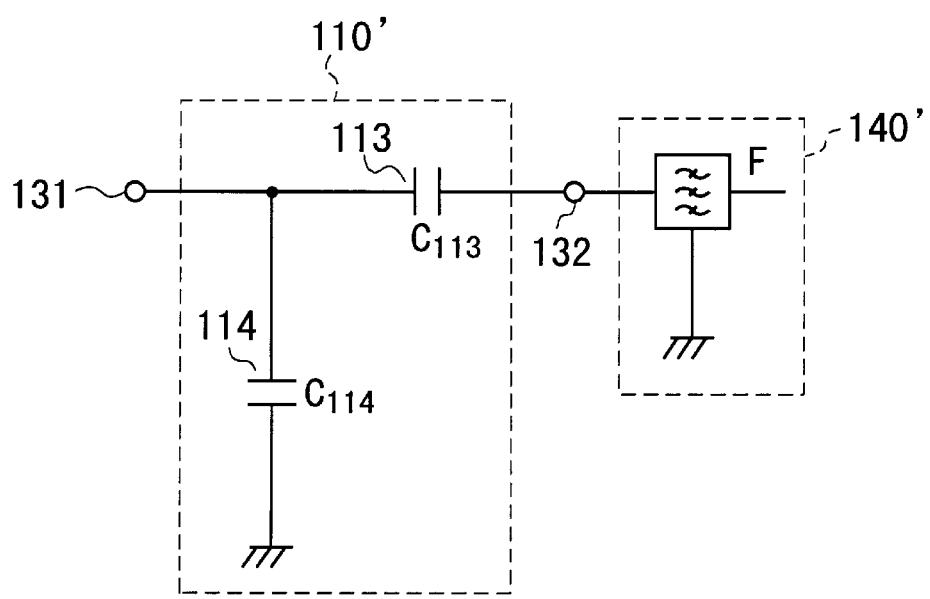
FIG. 15 is a circuit diagram of a conventional impedance-matching circuit obtained by replacing each inductor with a capacitor in the first conventional impedance-matching circuit of FIG. 12.

Unlike this, the impedance-matching circuit 1b according to the second embodiment corresponds to a conventional impedance-matching circuit 110' having the "C—C matching" configuration, as shown in FIG. 15, where the circuit 110' is formed by two capacitors 113 and 114 having the capacitances $C_{113}$ and $C_{114}$. In other words, the impedance-matching circuit 1b according to the second embodiment comprises first and second reactance circuits 30 and 40 equivalent respectively to the capacitors 113 and 114.

With the impedance-matching circuit 1b according to the second embodiment, as explained later, the initial points $D_1$ and $D_2$ are shifted in the "negative" direction on the Smith chart of FIG. 14. This circuit 1b is suitable to the case where a RF circuit 4' located at the output terminal 3 has an inductive impedance (e.g., a filter F).

In FIG. 15, the conventional impedance-matching circuit 110' is connected to the terminal 132. Two terminals of the capacitor 113 are connected to the terminals 131 and 132. One terminal of the capacitor 114 is connected to the terminal 131 and the other terminal is connected to the ground.

Figure 19:
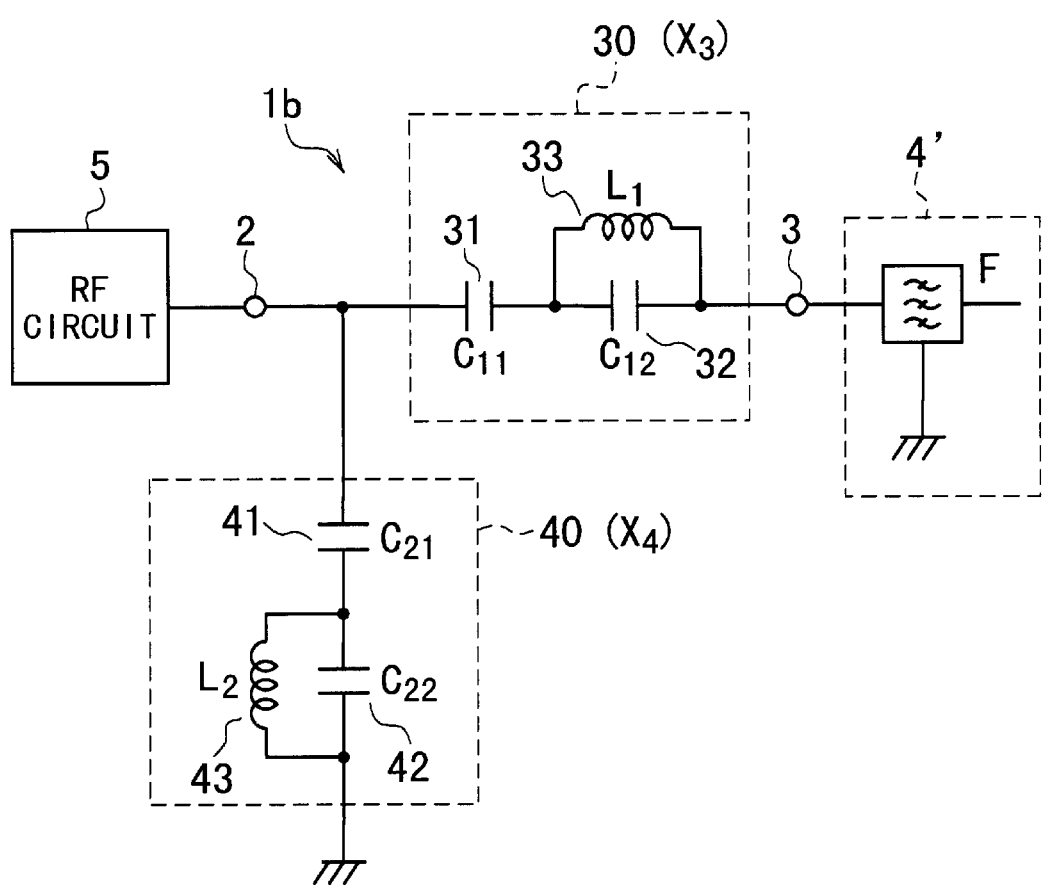
FIG. 19 is a circuit diagram showing the concrete configuration of the impedance-matching circuit according to the second embodiment.

As shown in FIG. 19, the first reactance circuit 30 having the reactance $X_3$ is formed by three reactance elements 31, 32, and 33. The element 31 is a capacitor having a capacitance $C_{11}$. The element 32 is a capacitor having a capacitance $C_{12}$. The element 33 is an inductor having an inductance $L_1$.

The capacitor 32 and the inductor 33 are connected in parallel. One terminal of the capacitor 32 and one terminal of the inductor 33 are connected in common to the output terminal 3 of the impedance-matching circuit 1b. The other terminal of the capacitor 32 and the other terminal of the inductor 33 are connected in common to one terminal of the capacitor 31. The other terminal of the capacitor 31 is connected to the input terminal 2 of the circuit 1b.

Figure 16A:
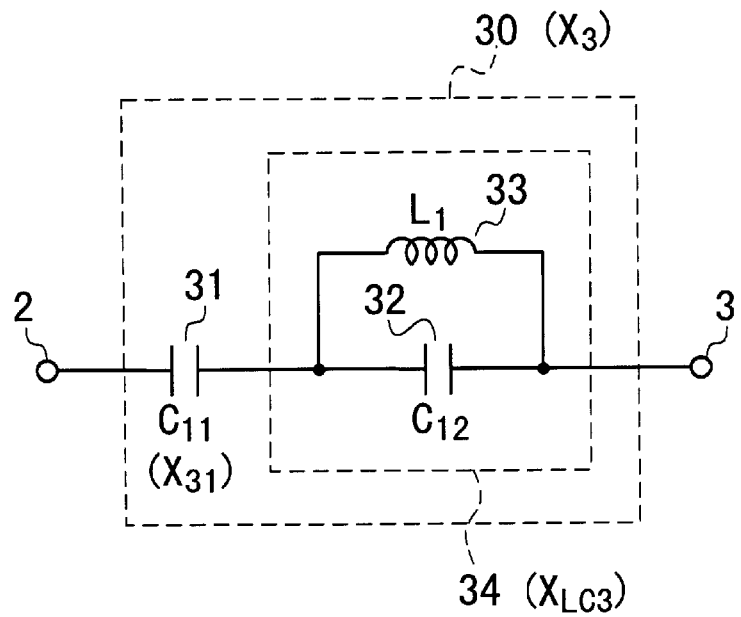
FIG. 16A is a circuit diagram of a first reactance circuit in an impedance-matching circuit according to a second embodiment shown in FIG. 19.

The parallel-connected capacitor 32 and inductor 33 constitute a parallel resonant circuit 34 having a resonant frequency $f_{03}$, as shown in FIG. 16A. Thus, it is said that the first reactance circuit 30 is formed by the parallel resonant circuit 34 and the capacitor 31 connected in series thereto between the input and output terminals 2 and 3.

As shown in FIG. 19, the second reactance circuit 40 is formed by three reactance elements 41, 42, and 43. The element 41 is a capacitor having a capacitance $C_{21}$. The element 42 is a capacitor having a capacitance $C_{22}$. The element 43 is an inductor having an inductance $L_2$.

The capacitor 42 and the inductor 43 are connected in parallel. One terminal of the capacitor 42 and one terminal of the inductor 43 are connected in common to the ground. The other terminal of the capacitor 42 and the other terminal of the inductor 43 are connected in common to one terminal of the capacitor 41. The other terminal of the capacitor 41 is connected to the input terminal 2 of the circuit 1b.

Figure 16B:
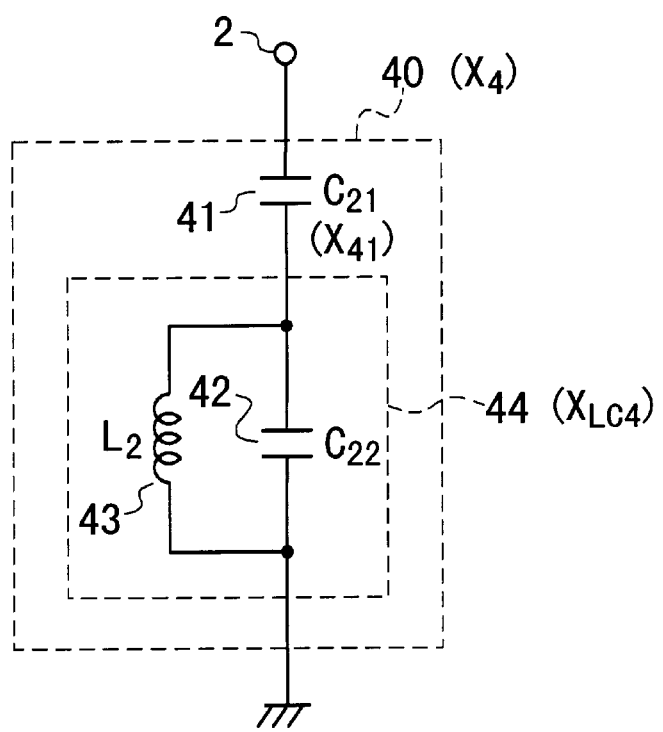
FIG. 16B is a circuit diagram of a second reactance circuit in the impedance-matching circuit according to the second embodiment of FIG. 19.

The parallel-connected capacitor 42 and inductor 43 constitute a parallel resonant circuit 44 having a resonant frequency $f_{04}$, as shown in FIG. 16B. Thus, it is said that the second reactance circuit 40 is formed by the parallel resonant circuit 44 and the capacitor 41 connected in series thereto between the input terminal 2 and the ground. The resonant frequency $f_{04}$ of the circuit 44 is typically different from the resonant frequency $f_{03}$ of the parallel resonant circuit 34.

Here, each of the first and second reactance circuits 30 and 40 is formed by only reactance elements (i.e., the imaginary part of the impedance) and is comprised of no resistance element (i.e., the real part of the impedance). However, if each of the first and second reactance circuits 30 and 40 contains any resistance element, they may be respectively replaced with impedance circuits, which leads to the basic circuit configuration shown in FIG. 8A.

Subsequently, the operation of the above-described first and second reactance circuits 30 and 40 is explained below.

First, the reactance $X_{31}$ of the capacitor 31 of the first reactance circuit 30 is given by the following equation (7).

$$X_{31} = \frac{-j}{(2\pi f)C_{11}} \quad (7)$$

Figure 17A:
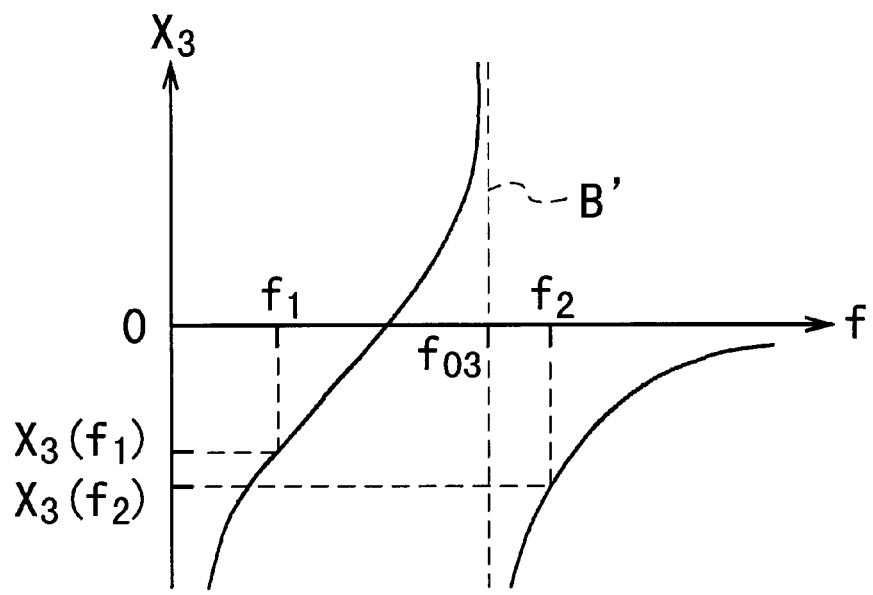
FIG. 17A is a graph showing schematically the frequency characteristic of the reactance of the first reactance circuit in the impedance-matching circuit according to the second embodiment of FIG. 19.
Figure 17B:
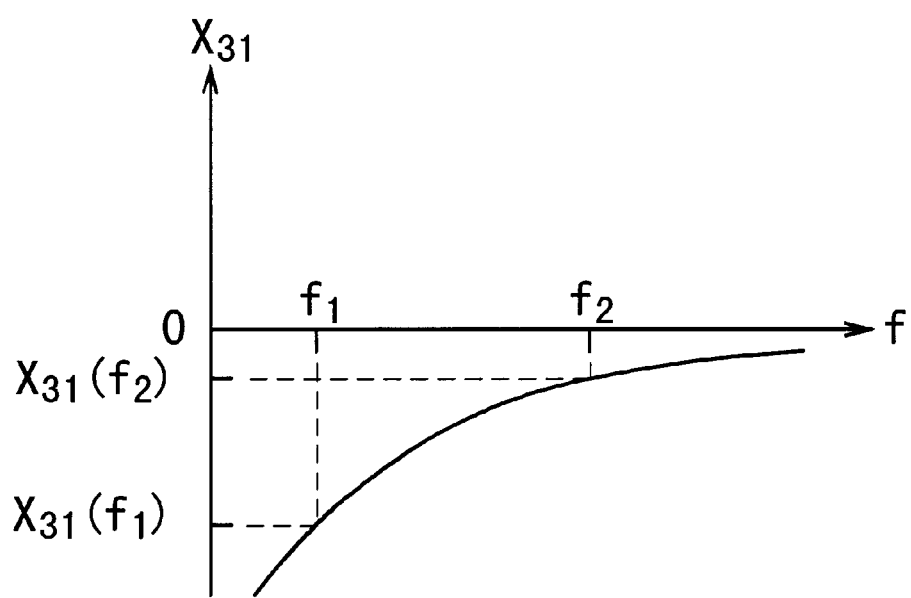
FIG. 17B is a graph showing schematically the frequency characteristic of the reactance of the capacitor used in the first reactance circuit of the impedance-matching circuit according to the second embodiment of FIG. 19.

The reactance $X_{31}$ given by the equation (7) has a frequency characteristic shown in FIG. 17B. Specifically, the frequency characteristic of the reactance $X_{31}$ is expressed by a curve having the f and $X_{31}$ axes as its asymptotes. Thus, the reactance $X_{31}$ increases monotonously from the negative infinity with the rising frequency and then, it finally converges on zero.

On the other hand, the reactance $X_{LC3}$ of the parallel resonant circuit 34 is given by the following equation (8).

$$X_{LC3} = \frac{j}{\frac{1}{(2\pi f)L_1} - (2\pi f)C_{12}} \quad (8)$$

The reactance $X_{LC3}$ given by the equation (8) has a same frequency characteristic as shown in FIG. 11C. Specifically, the frequency characteristic of the reactance $X_{LC3}$ is expressed by curves having a vertical asymptote B located at the resonant frequency of $f_{03}$. The resonant frequency $f_{03}$ of the parallel resonant circuit 34 is expressed as $$f_{03} = \frac{1}{2\pi\sqrt{L_1 C_{12}}} \quad (9)$$

As seen from FIG. 11C, when the signal frequency f is lower than the resonant frequency $f_{03}$, the reactance $X_{LC3}$ of the parallel resonant circuit 34 increases gradually from zero as the signal frequency f is raised and then, it approaches the positive infinite in the vicinity of $f_{03}$. When the signal frequency f is higher than the resonant frequency $f_{03}$, the reactance $X_{LC3}$ decreases gradually as the signal frequency f is lowered and then, it approaches the negative infinite in the vicinity of $f_{01}$. On the other hand, the reactance $X_{LC3}$ converges on zero as the frequency f is further raised.

As seen from the circuit configuration of FIG. 16A, the reactance $X_3$ of the first reactance circuit 30 is equal to the sum of the reactance $X_{31}$ of the capacitance 31 and the reactance $X_{LC3}$ of the parallel resonant circuit 34. Thus, the frequency characteristic of the reactance $X_3$ is given by summing or combining the frequency characteristics of the reactances $X_{31}$ and $X_{LC3}$, as shown in FIG. 17A.

As seen from FIG. 17A, the frequency characteristic of the reactance $X_3$ of the first reactance circuit 30 has a same tendency as that of the reactance $X_{LC3}$ of the parallel resonant circuit 34. Specifically, the frequency characteristic of the reactance $X_3$ is given by the curves having a vertical line B' located at the frequency $f_{03}$ as its asymptote. When the signal frequency f is lower than the resonant frequency $f_{03}$, the reactance $X_3$ increases gradually from the negative infinite as the signal frequency f is raised and then, it approaches the positive infinite in the vicinity of $f_{03}$. When the signal frequency f is higher than the resonant frequency $f_{03}$, the reactance $X_3$ decreases gradually as the signal frequency f is lowered and then, it approaches the negative infinite in the vicinity of $f_{03}$. On the other hand, the reactance $X_3$ converges on zero as the frequency f is further raised.

Also, when the signal frequency f is lower than the resonant frequency $f_{03}$, the reactance $X_3$ may have any value from the negative infinite to the positive infinite. When the signal frequency f is lower than the resonant frequency $f_{03}$, the reactance $X_3$ may have any negative value only. On the other hand, the resonant frequency $f_{03}$ needs to be selected between the desired matching frequencies $f_1$ and $f_2$. If the value of the resonant frequency $f_{03}$ is varied under this condition, the vertical asymptote B' (and consequently, the characteristic curves) is shifted along the f axis. Thus, by suitably setting the value of the resonant frequency $f_{03}$, the reactance $X_3$ can be set as desired values at the separated frequencies $f_1$ and $f_2$, which are independent of each other. This means that the values of the reactance $X_3$ at the distant frequencies $f_1$ and $f_2$ can be optionally adjusted.

In FIGS. 17A and 17B, the symbols $X_{31}(f_1)$ and $X_{31}(f_2)$ denote the values of the reactance $X_{31}$ of the capacitor 31 at the frequencies $f_1$ and $f_2$, respectively. The symbols $X_3(f_1)$ and $X_3(f_2)$ denote the values of the reactance $X_3$ of the first reactance circuit 30 at the frequencies $f_1$ and $f_2$, respectively.

The desired values of the capacitance $C_{11}$ and $C_{12}$ of the capacitors 31 and 32 and the inductance $L_1$ of the inductor 33, which form the first reactance circuit 30, are difficult to be analytically solved directly from the known values of the reactance $X_3$ of the circuit 30 and the frequencies $f_1$ and $f_2$. However, they can be numerically found by obtaining asymptotically the convergent values of $C_{11}$, $C_{12}$, and $L_1$ using a computer.

Additionally, as seen from the frequency characteristic in FIG. 17A, the impedance-matching circuit 1b according to the second embodiment has a limit that the value $X_3(f_2)$ of the reactance $X_3$ at the higher frequency $f_2$ may be always negative while the value $X_3(f_1)$ of the reactance $X_3$ at the lower frequency $f_1$ may be positive or negative. Thus, the impedance-matching circuit 1b is unable to be applied to any case necessitating a positive value of $X_3(f_2)$. However, this limit can be removed by using one of the first, third, or fourth embodiments of the invention as at least one of the first and second reactance circuits 30 and 40.

Next, the second reactance circuit 40 is explained below. As seen from FIG. 19, the circuit 40 has the same configuration as that of the first reactance circuit 30. As a result, the above explanation about the first reactance circuit 30 is applied to the second reactance circuit 40.

Specifically, the reactance $X_{41}$ of the capacitor 41 of the second reactance circuit 40 is given by the following equation (10).

$$X_{41} = \frac{-j}{(2\pi f)C_{21}} \quad (10)$$

The reactance $X_{41}$ given by the equation (10) has a same frequency characteristic as shown in FIG. 17B. The frequency characteristic of the reactance $X_{41}$ is expressed by a curve having the f and $X_{41}$ axes as its asymptotes. Thus, the reactance $X_{41}$ is always negative and increases monotonously from the negative infinite with the rising frequency f, finally converging on zero.

On the other hand, the reactance $X_{LC4}$ of the parallel resonant circuit 44 is given by the following equation (11).

$$X_{LC4} = \frac{j}{\frac{1}{(2\pi f)L_2} - (2\pi f)C_{22}} \quad (11)$$

The reactance $X_{LC4}$ given by the equation (11) has a same frequency characteristic as shown in FIG. 11C. Specifically, the frequency characteristic of the reactance $X_{LC4}$ is expressed by the curves having a vertical asymptote B located at the resonant frequency of $f_{04}$. The resonant frequency $f_{04}$ of the parallel resonant circuit 44 is expressed as $$f_{04} = \frac{1}{2\pi\sqrt{L_2 C_{22}}} \quad (12)$$

As seen from FIG. 11C, when the signal frequency f is lower than the resonant frequency $f_{04}$, the reactance $X_{LC4}$ of the parallel resonant circuit 44 increases gradually from zero as the signal frequency f is raised and then, it approaches the positive infinite in the vicinity of $f_{04}$. When the signal frequency f is higher than the resonant frequency $f_{04}$, the reactance $X_{LC4}$ decreases gradually as the signal frequency f is lowered and then, it approaches the negative infinite in the vicinity of $f_{04}$. On the other hand, the reactance $X_{LC4}$ converges on zero as the frequency f is further raised.

As seen from the circuit configuration of FIG. 16B, the reactance $X_4$ of the second reactance circuit 40 is equal to the sum of the reactance $X_{41}$ of the capacitor 41 and the reactance $X_{LC4}$ of the parallel resonant circuit 44. Thus, the frequency characteristic of the reactance $X_4$ is given by summing or combining the frequency characteristics of the reactances $X_{41}$ and $X_{LC4}$, which is the same as shown in FIG. 17A.

As seen from FIG. 17A, the frequency characteristic of the reactance $X_4$ of the second reactance circuit 40 has a same tendency as that of the reactance $X_{LC4}$ of the parallel resonant circuit 44. Specifically, when the signal frequency f is lower than the resonant frequency $f_{04}$, the reactance $X_4$ increases gradually from zero as the signal frequency f is raised and then, it approaches the positive infinite in the vicinity of $f_{04}$. When the signal frequency f is higher than the resonant frequency $f_{04}$, the reactance $X_4$ decreases gradually as the signal frequency f is lowered and then, it approaches the negative infinite in the vicinity of $f_{04}$. On the other hand, the reactance $X_4$ converges on zero as the frequency f is further raised.

Also, when the signal frequency f is lower than the resonant frequency $f_{04}$, the reactance $X_4$ may have any value from the negative infinite to the positive infinite. When the signal frequency f is higher than the resonant frequency $f_{04}$, the reactance X may have any negative value only. On the other hand, the resonant frequency $f_{04}$ needs to be selected between the desired matching frequencies $f_1$ and $f_2$. If the value of the resonant frequency $f_{04}$ is varied under this condition, the vertical asymptote B' (and consequently, the characteristic curves) is shifted along the f axis. Thus, by suitably setting the value of the resonant frequency $f_{04}$, the reactance $X_4$ can be set as desired values at the separated frequencies $f_1$ and $f_2$, which are independent of each other. This means that the values of the reactance $X_4$ at the distant frequencies $f_1$ and $f_2$ can be optionally adjusted.

The desired values of the capacitance $C_{21}$ and $C_{22}$ of the capacitors 41 and 42 and the inductance $L_2$ of the capacitor 43, which form the second reactance circuit 40, are difficult to be analytically solved directly from the known values of the reactance $X_4$ of the circuit 40 and the frequencies $f_1$ and $f_2$. However, they can be numerically found by obtaining asymptotically the convergent values of $C_{21}$, $C_{22}$, and $L_2$ using a computer.

Additionally, as seen from the frequency characteristic in FIG. 17A, the impedance-matching circuit 1b according to the second embodiment has a limit that the value of the reactance $X_4$ at the higher frequency $f_2$ is always negative while the value of the reactance $X_4$ at the lower frequency $f_1$ may be positive or negative. Thus, the impedance-matching circuit $1b$ is unable to be applied to any case necessitating a positive value of the reactance $X_4$ at $f_2$. However, this limit can be removed by using first, third, or fourth embodiment of the invention as at least one of the first and second reactance circuits 30 and 40.

As described above, with the impedance-matching circuit $1b$ according to the second embodiment of the invention, by suitably setting respectively the values of the reactances $X_3$ and $X_4$ of the first and second reactance circuits 30 and 40 at the frequencies $f_1$ and $f_2$, the input impedance of the RF circuit 4' and the output impedance of the RF circuit 5 can be set at their optimum value or values at $f_1$ and $f_2$. This simplifies the circuit configuration of a system capable of handling signals in two separate frequency bands (e.g., 820 MHz and 1900 MHz bands). Moreover, the electric-power loss due to impedance matching can be prevented from being increased.

Next, the operation principle to realize the complete impedance matching at $f_1$ and $f_2$ in the impedance-matching circuit $1b$ according to the second embodiment is explained below with reference to the Smith chart on FIG. 18.

Here, similar to the first embodiment, it is supposed that the input impedance of the RF circuit 4' at the output terminal 3 is matched with the output impedance (=50 $\Omega$) of the RF circuit 5 at the input terminal 2 by the impedance-matching circuit $1b$.

Figure 18:
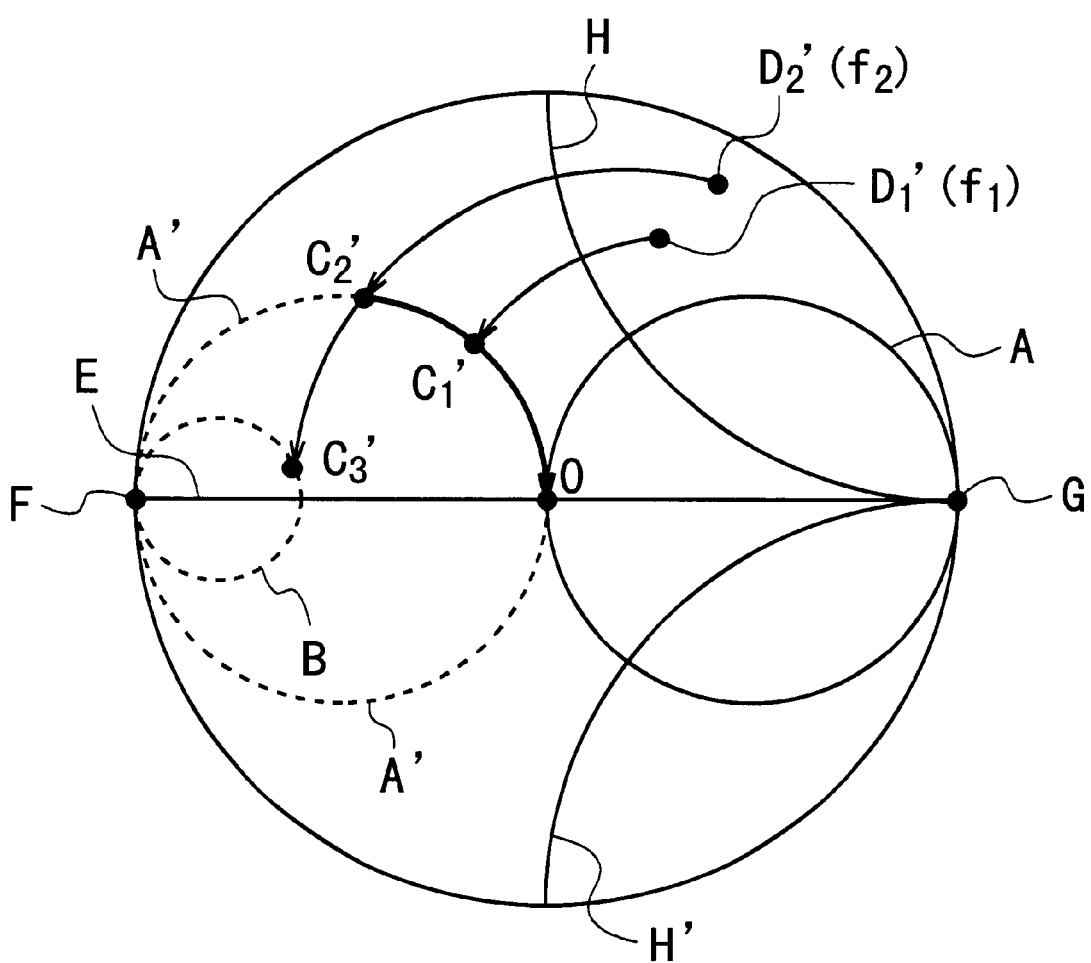
FIG. 18 is a Smith chart showing the operation of the first reactance circuit in the impedance-matching circuit according to the second embodiment of FIG. 19.

In the Smith chart of FIG. 18, the initial points $D_1'$ and $D_2'$ correspond to the output impedance values of the RF circuit 4' at the frequencies $f_1$ and $f_2$, respectively. The reactance values at the points $D_1'$ and $D_2'$ are positive. The other reference symbols are the same as those in FIG. 14.

First, the values of the reactance $X_3$ of the first reactance circuit 30 at $f_1$ and $f_2$ are suitably set, thereby moving the initial points $D_1'$ and $D_2'$ to the temporary points $C_1'$ and $C_2'$ located on the circle A', respectively. In other words, the values of the reactance $X_3$ of the first reactance circuit 30 at $f_1$ and $f_2$ have the same admittance of (1/50 $\Omega$).

Then, the values of the reactance $X_4$ of the second reactance circuit 40 at $f_1$ and $f_2$ are suitably set, thereby moving the temporary points $C_1'$ and $C_2'$ along the circle A' to the central point O, respectively. In other words, while the values of the total admittance of the impedance-matching circuit $1b$ at $f_1$ and $f_2$ are kept at (1/50 $\Omega$), the reactance components of the circuit $1b$ is equal to zero. Thus, the input impedance of the RF circuit 4' is matched with the output impedance 50 $\Omega$ of the RF circuit 5 at both the frequencies $f_1$ and $f_2$.

In contrast, such the movement of the points as shown in FIG. 18 is impossible in the conventional impedance-matching circuit 110' of FIG. 15 because of the following reason. If the initial point $D_1'$ representing the input impedance of the circuit 140' at the frequency $f_1$ is moved to the temporary point $C_1'$ located on the circle A' due to the reactance $X_{113}$ of the capacitor 113, the initial point $D_2'$ representing the input impedance of the circuit 140' at the frequency $f_2$ is moved to the temporary point $C_3'$ located on the circle B (not to the temporary point $C_2'$).

As described above, with the impedance-matching circuit $1b$ according to the second embodiment, the initial points $D_1'$ and $D_2'$ can be respectively moved to the temporary points $C_1'$ and $C_2'$ by adjusting the values of the reactance $X_3$ of the first reactance circuit 30 at $f_1$ and $f_2$ and then, the temporary points $C_1'$ and $C_2'$ can be respectively moved to overlap with the central point O by adjusting the values of the reactance $X_4$ of the second reactance circuit 40 at $f_1$ and $f_2$. Thus, impedance matching between the RF circuits 5 and 4' can be realized at both the frequencies $f_1$ and $f_2$.

Third Embodiment

Figure 20:
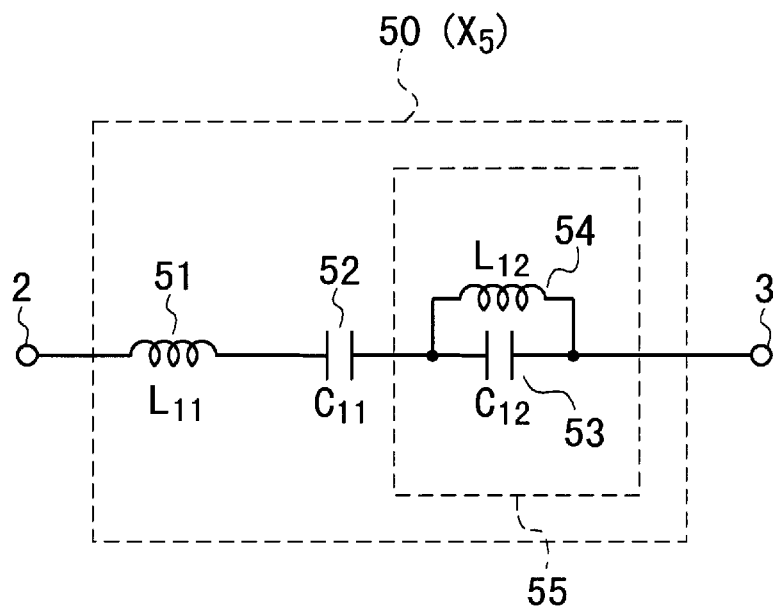
FIG. 20 is a circuit diagram of a first reactance circuit used in an impedance-matching circuit according to a third embodiment.

FIG. 20 shows a first reactance circuit 50 used in an impedance-matching circuit according to a third embodiment of the present invention.

In the above-described impedance-matching circuit $1a$ according to the first embodiment shown in FIG. 9, the impedance matching is unable to be realized in the cases necessitating a negative value of the reactance of $X_1$ or $X_2$ at the frequency $f_1$. In the above-described impedance-matching circuit $1b$ according to the second embodiment shown in FIG. 19, the impedance matching is unable to be realized in the cases necessitating a positive value of the reactance of $X_3$ or $X_4$ at the frequency $f_2$. However, the impedance-matching circuit according to the third embodiment can remove these limits, in which the reactances of the first and second reactance circuits may be positive and negative.

As shown in FIG. 20, the first reactance circuit 50 is formed by four reactance elements 51, 52, 53, and 54. The elements 51 and 54 are inductors having inductances $L_{11}$ and $L_{12}$. The elements 52 and 53 are capacitors having capacitances $C_{11}$ and $C_{12}$.

The inductor 54 and the capacitor 53 are connected in parallel. One terminal of the inductor 54 and one terminal of the capacitor 53 are connected in common to the output terminal 3 of the impedance-matching circuit. The other terminal of the inductor 54 and the other terminal of the capacitor 53 are connected in common to one terminal of the capacitor 52. The other terminal of the capacitor 52 is connected to one terminal of the inductor 51. The other terminal of the inductor 51 is connected to the input terminal 2 of the impedance-matching circuit.

The parallel-connected inductor 54 and capacitor 53 constitute a parallel resonant circuit 55 having a resonant frequency $f_{O5}$. Thus, it is said that the first reactance circuit 50 is formed by the parallel resonant circuit 55 and the inductor 51 and the capacitor 52 both connected in series to the circuit 55 between the input and output terminals 2 and 3.

The frequency characteristic of the reactance $X_5$ of the first reactance circuit 50 is obtained by combining the frequency characteristics of the inductor 51 (see FIG. 11B), the capacitor 52 (see FIG. 17B), and the parallel resonant circuit 55 (see FIG. 11C). In other words, the frequency characteristic of the reactance $X_5$ of the first reactance circuit 50 is equal to the sum of the frequency characteristics of the first reactance circuit $10a$ (see FIG. 11A) and the capacitor 52 (see FIG. 17B), which is shown in FIG. 21.

Figure 21:
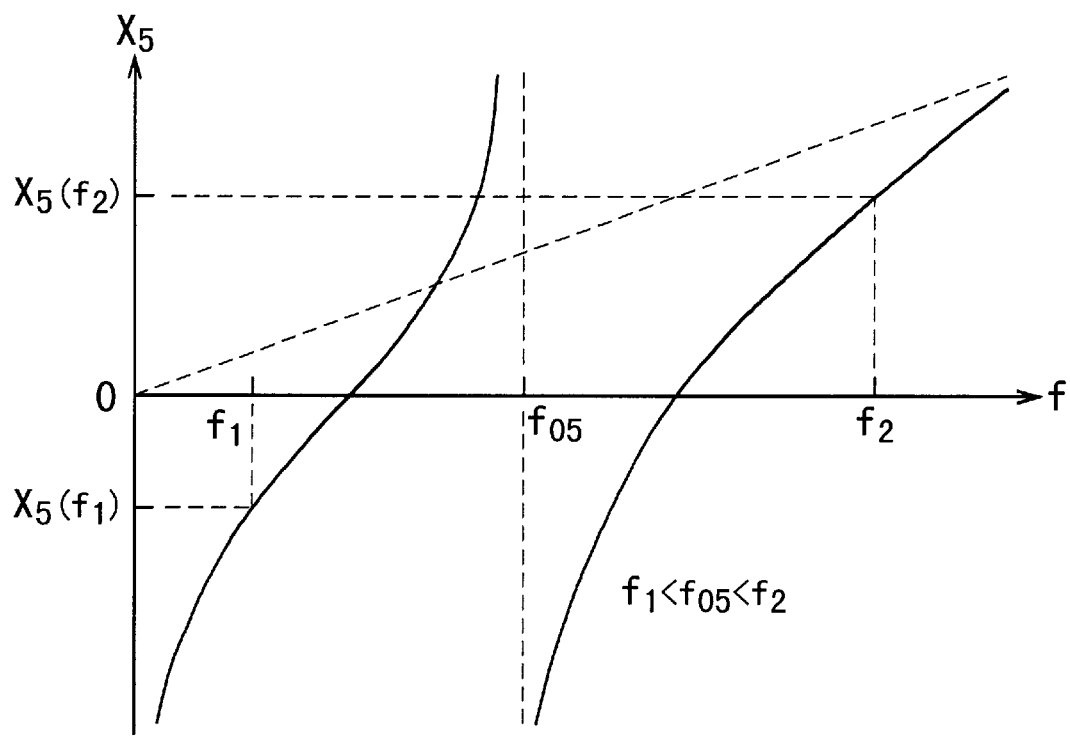
FIG. 21 is a graph showing schematically the frequency characteristic of the reactance of the first reactance circuit of FIG. 20 used in the impedance-matching circuit according to the third embodiment.

As seen from FIG. 21, the reactance $X_5$ of the first reactance circuit 50 may be positive and negative. As a result, there is the same advantages as those in the first and second embodiments and an additional advantage that the limit included in the impedance-matching circuits $1a$ and $1b$ according to the first and second embodiments can be removed.

The configuration of a second reactance circuit (not shown) is typically equal to that of the first reactance circuit 50 of FIG. 20. However, the second reactance circuit may have the same configuration as that of the first and second reactance circuits in the first or second embodiment.

Fourth Embodiment

Figure 22:
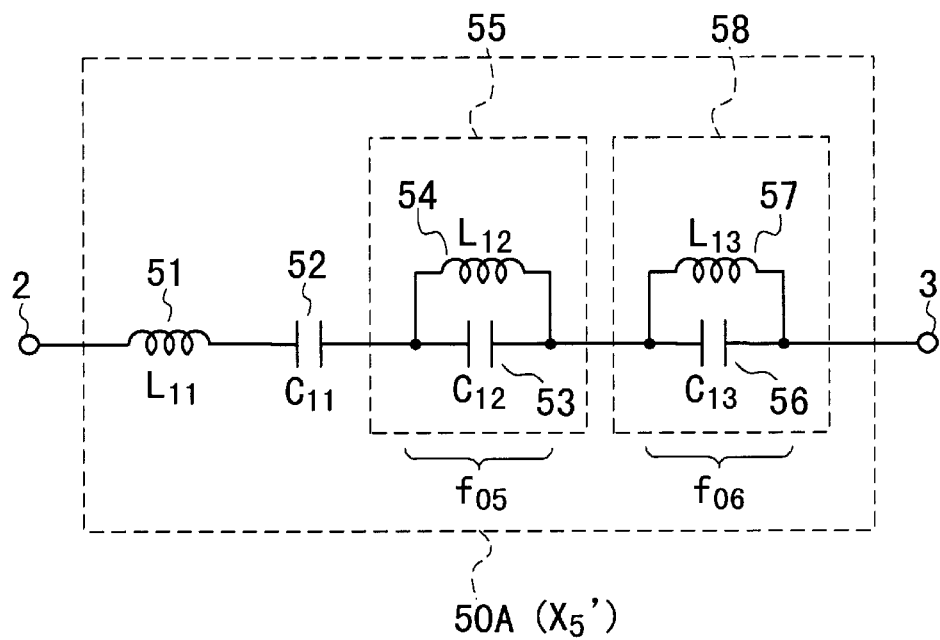
FIG. 22 is a circuit diagram of a first reactance circuit used in an impedance-matching circuit according to a fourth embodiment.

FIG. 22 shows a first reactance circuit 50A used in an impedance-matching circuit according to a fourth embodiment of the present invention. This is a variation of the first reactance circuit 50 used in the impedance-matching circuit according to the fourth embodiment in FIG. 20.

As shown in FIG. 22, the first reactance circuit 50A has a configuration where two reactance elements 56 and 57 are added to the first reactance circuit 50 in FIG. 20. The added reactance elements 56 and 57 are a capacitor having a capacitance $C_{13}$ and an inductor having an inductance $L_{13}$, respectively.

The inductor 57 and the capacitor 56 are connected in parallel. One terminal of the inductor 57 and one terminal of the capacitor 56 are connected in common to the output terminal 3 of the impedance-matching circuit. The other terminal of the inductor 57 and the other terminal of the capacitor 56 are connected in common to one terminal of the parallel resonant circuit 55. The other terminal of the parallel resonant circuit 55 is connected to one terminal of the capacitor 52. The other terminal of the capacitor 52 is connected to one terminal of the inductor 51. The other terminal of the inductor 51 is connected to the input terminal 2 of the impedance-matching circuit.

The parallel-connected inductor 57 and capacitor 56 constitute a parallel resonant circuit 58 having a resonant frequency $f_{06}$. Thus, it is said that the first reactance circuit 50A is formed by the parallel resonant circuits 55 and 58, the inductor 51, and the capacitor 52, which are connected in series between the input and output terminals 2 and 3.

Figure 23:
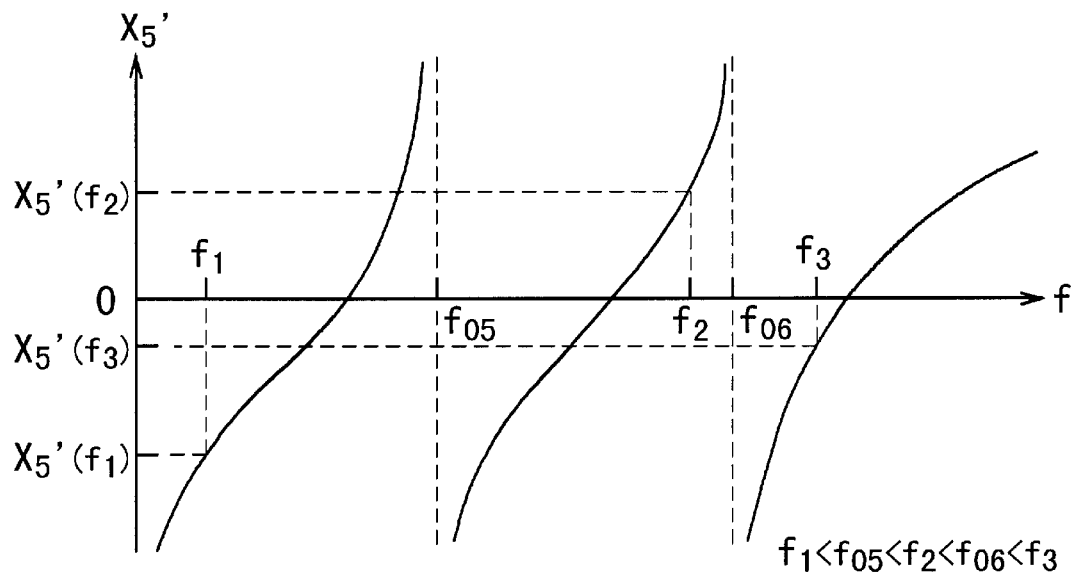
FIG. 23 is a graph showing schematically the frequency characteristic of the reactance of the first reactance circuit of FIG. 22 used in the impedance-matching circuit according to the fourth embodiment.

FIG. 23 shows the frequency characteristic of the reactance $X_s'$ of the first reactance circuit 50A. This is obtained by combining the frequency characteristic (FIG. 21) of the first reactance circuit 50 used in the third embodiment and the frequency characteristic (FIG. 11C) of the parallel resonant circuit 58 (see FIG. 11C).

As seen from FIG. 23, the reactance $X_s'$ of the first reactance circuit 50A may be positive and negative. As a result, there is the same advantages as those in the first and second embodiments and an additional advantage that complete impedance matching can be realized at the three different frequencies $f_1$, $f_2$, and $f_3$ and that the limit included in the impedance-matching circuits 1a and 1b according to the first and second embodiments can be removed. The matching frequencies $f_1$, $f_2$, and $f_3$ and the resonant frequencies $f_{05}$ and $f_{06}$ have the relationship of $f_1 < f_{05} < f_2 < f_{06} < f_3$.

The configuration of a second reactance circuit (not shown) is typically equal to that of the first reactance circuit 50A of FIG. 22. However, the second reactance circuit may have the same configuration as that of the first and second reactance circuits in the first, second, or third embodiment.

As explained above, complete impedance matching is realized at the three different frequencies $f_1$, $f_2$, and $f_3$ in the fourth embodiment. However, the present invention is not limited to this case. It is needless to say that complete impedance matching can be realized at four or more different frequencies by adding one parallel resonant circuit or more to the circuit configuration of FIG. 22.

Fifth Embodiment

In the above-described first to fourth embodiments, each of the first and second reactance circuits comprises at least one "parallel resonant circuit". However, the present invention is not limited thereto. As explained below, a "series resonant circuit" may be used in the present invention.

Figure 24A:
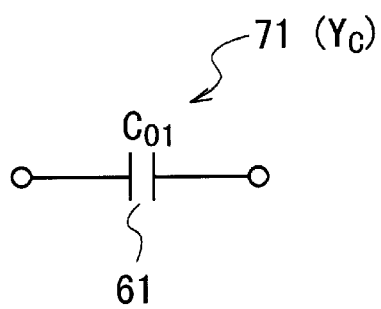
FIG. 24A is a circuit diagram of a reactance circuit consisting of a single inductor.

FIG. 24A shows a reactance circuit 71 consisting of a single capacitor 61 having a capacitance $C_{01}$. The admittance of the circuit 71 is expressed by the following equation (13).

$$Y_c = j(2\pi f)C_{01} \quad (13)$$

Figure 24B:
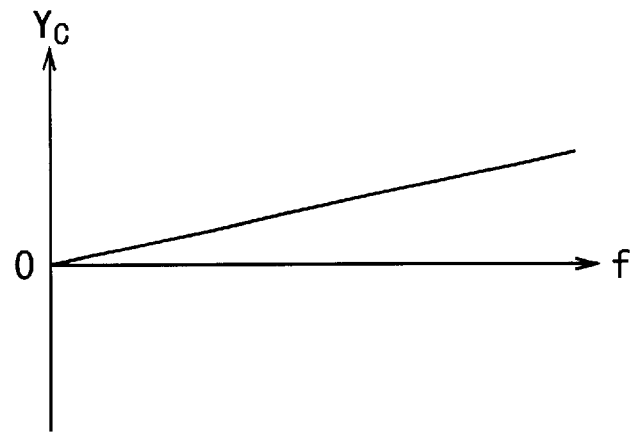
FIG. 24B is a graph showing schematically the frequency characteristic of the admittance of the reactance circuit shown in FIG. 24A.

The admittance $Y_c$ given by equation (13) has a frequency characteristic shown in FIG. 24B, which has the same tendency as that of the reactance $X_{11}$ in FIG. 11B.

Figure 25A:
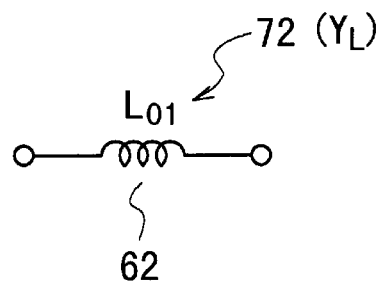
FIG. 25A is a circuit diagram of a reactance circuit consisting of a single capacitor.

FIG. 25A shows a reactance circuit 72 consisting of a single inductor 62 having an inductance $L_{01}$. The admittance of $Y_L$ the circuit 72 is expressed by the following equation (14).

$$Y_L = \frac{-j}{(2\pi f)L_{01}} \quad (14)$$

Figure 25B:
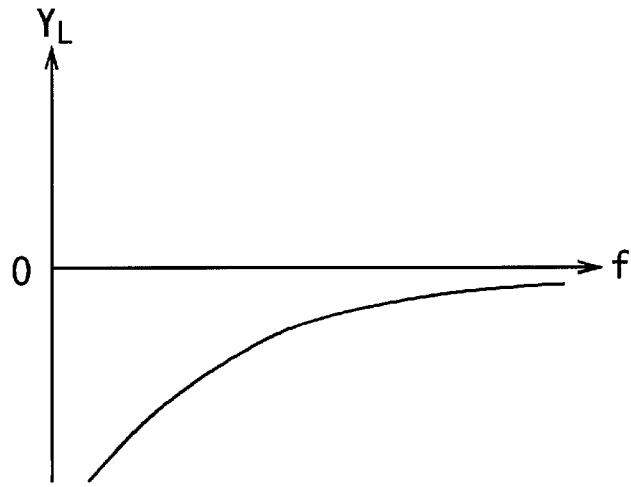
FIG. 25B is a graph showing schematically the frequency characteristic of the admittance of the reactance circuit shown in FIG. 25A.

The admittance $Y_L$ given by equation (14) has a frequency characteristic shown in FIG. 25B, which has the same tendency as that of the reactance $X_{31}$ in FIG. 17B.

Figure 26A:
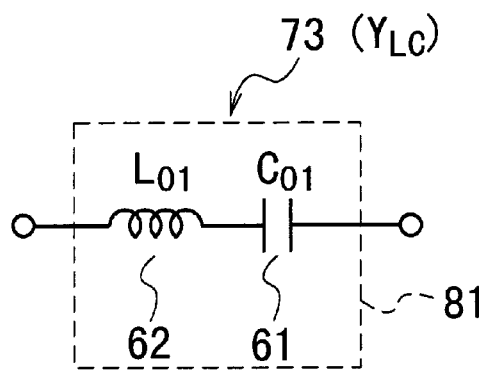
FIG. 26A is a circuit diagram of a reactance circuit consisting of a series resonant circuit formed by an inductor and a capacitor connected in series.

FIG. 26A shows a reactance circuit 73 consisting of the inductor 62 and the capacitor 61 shown in FIGS. 25A and 24A, which are connected in series. The inductor 62 and the capacitor 61 constitute a series resonant circuit 81 having a resonant frequency $f_0$. The admittance $Y_{LC}$ of the circuit 73 or 81 is expressed by the following equation (15).

$$Y_{LC} = \frac{j}{\frac{1}{(2\pi f)C_{01}} - (2\pi f)L_{01}} \quad (15)$$

Figure 26B:
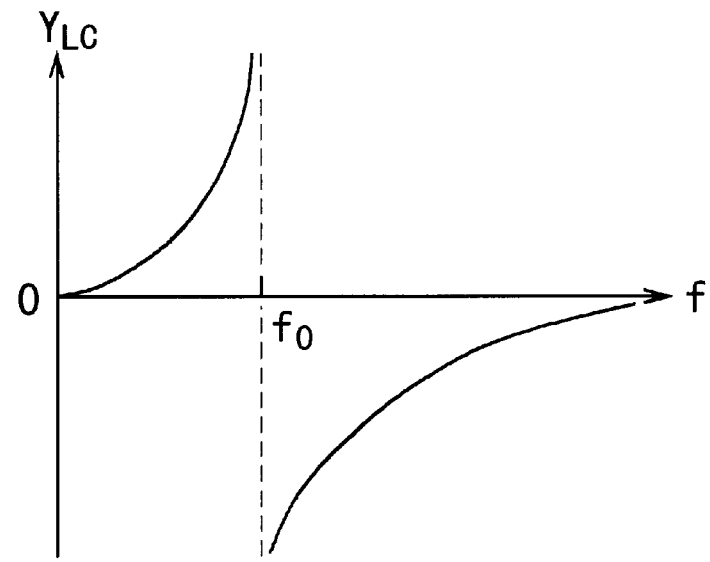
FIG. 26B is a graph showing schematically the frequency characteristic of the admittance of the reactance circuit shown in FIG. 26A.

The admittance $Y_{LC}$ given by equation (15) has a frequency characteristic shown in FIG. 26B, which has the same tendency as that of the reactance $X_{LC1}$ of the parallel resonant circuit 14 in FIG. 11C. Specifically, the frequency characteristic of the admittance $Y_{LC}$ is expressed by curves having a vertical asymptote located at the resonant frequency of $f_0$. The resonant frequency $f_0$ of the series resonant circuit 81 is expressed as $$f_0 = \frac{1}{2\pi\sqrt{L_{01}C_{01}}} \quad (16)$$

Figure 27A:
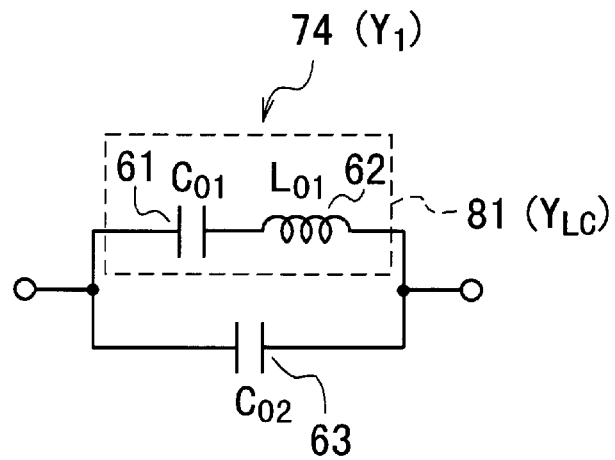
FIG. 27A is a circuit diagram of a reactance circuit used in an impedance-matching circuit according to a fifth embodiment of the present invention, where the reactance circuit consists of a series resonant circuit formed by an inductor and a capacitor connected in series, and a capacitor connected in parallel to the series resonant circuit.
Figure 27B:
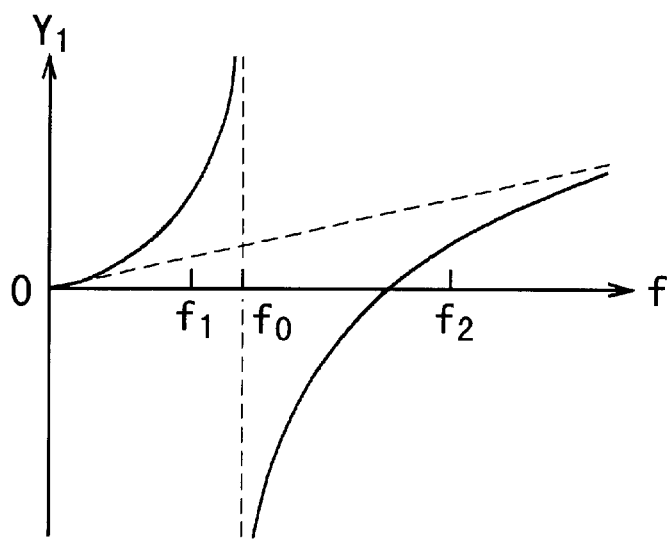
FIG. 27B is a graph showing schematically the frequency characteristic of the admittance of the reactance circuit shown in FIG. 27A.

FIG. 27A shows a reactance circuit 74 consisting of series resonant circuit 81 and a capacitor 63 having a capacitance $C_{02}$, which are connected in parallel. The admittance $Y_1$ of the reactance circuit 74 has a frequency characteristic shown in FIG. 27B, which has the same tendency as that of the reactance $X_1$ of the first reactance circuit 10a in FIG. 11A.

In an impedance-matching circuit according to a fifth embodiment of the present invention, the reactance circuit 74 of FIG. 27A is used as the first and second reactance circuits. The other configuration is the same as that of the first embodiment.

Admittance is an inverse of impedance. Therefore, if the value of admittance is optionally set as desired, it is clear that the value of impedance may be optionally set as desired. As a result, by setting the reactances or admittances of the first and second reactance circuits at suitable values, both of the initial points corresponding to the input impedance values of the RF circuit 4 and $f_1$ and $f_2$ can be moved to overlap with the central point O on the Smith chart of FIG. 14 in the same way as shown in the first embodiment. Thus, impedance matching can be realized between the RF circuits 5 and 4' at their optimum values at both the frequencies $f_1$ and $f_2$.

Sixth Embodiment

Figure 28A:
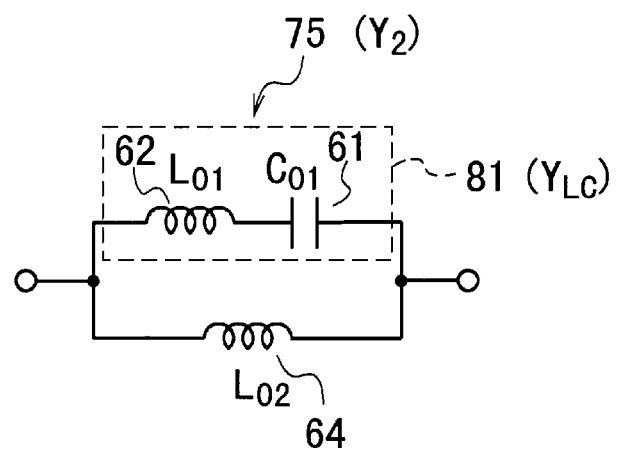
FIG. 28A is a circuit diagram of a reactance circuit used in an impedance-matching circuit according to a sixth embodiment of the present invention, where the reactance circuit consists of a series resonant circuit formed by an inductor and a capacitor connected in series, and an inductor connected in parallel to the series resonant circuit.
Figure 28B:
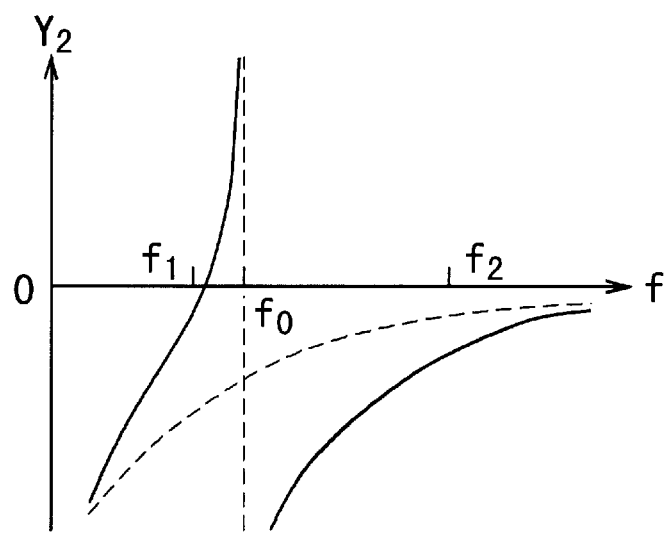
FIG. 28B is a graph showing schematically the frequency characteristic of the admittance of the reactance circuit shown in FIG. 28A.

FIG. 28A shows a reactance circuit 75 consisting of the series resonant circuit 81 and an inductor 64 having an inductance $L_{02}$, which are connected in parallel. The admittance $Y_2$ of the reactance circuit 75 has a frequency characteristic shown in FIG. 28B, which has the same tendency as that of the reactance $X_3$ of the first reactance circuit 20 in FIG. 17A. This is obtained by combining the frequency characteristics shown in FIGS. 26B and 25B.

In an impedance-matching circuit according to a sixth embodiment of the invention, the reactance circuit 75 of FIG. 28A is used as the first and second reactance circuits. The other configuration is the same as that of the second embodiment.

Seventh Embodiment

Figure 29A:
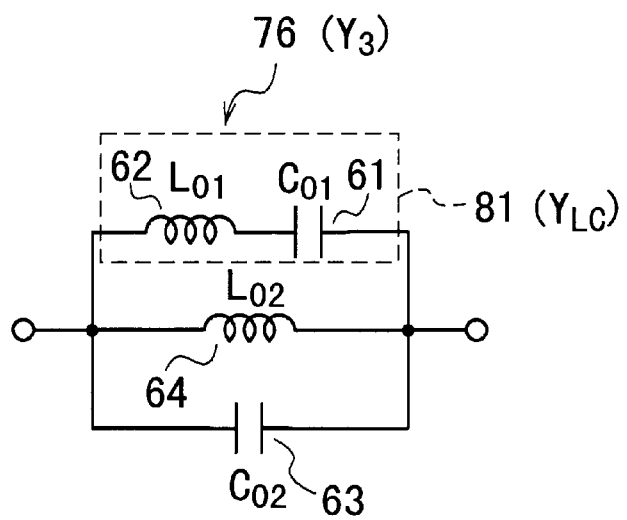
FIG. 29A is a circuit diagram of a reactance circuit used in an impedance-matching circuit according to a seventh embodiment of the present invention, where the reactance circuit consists of a series resonant circuit formed by an inductor and a capacitor connected in series, and an inductor and a capacitor both connected in parallel to the series resonant circuit.
Figure 29B:
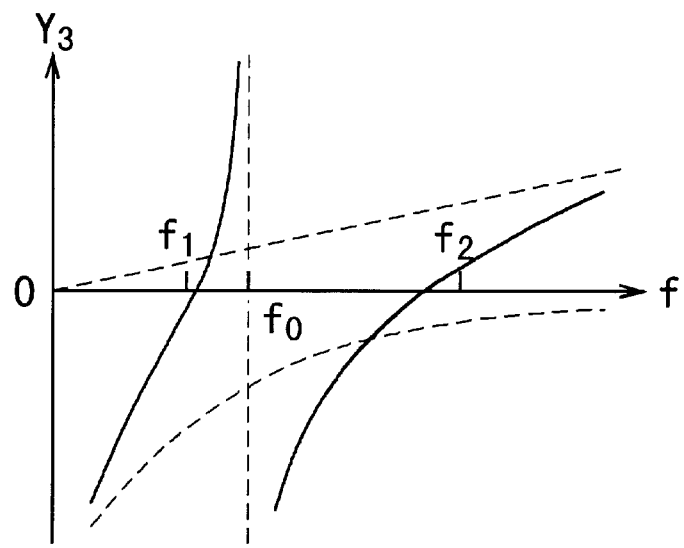
FIG. 29B is a graph showing schematically the frequency characteristic of the admittance of the reactance circuit shown in FIG. 29A.

FIG. 29A shows a reactance circuit 76 consisting of the series resonant circuit 81, the capacitor 63, and the inductor 64, which are connected in parallel. The admittance $Y_3$ of the reactance circuit 76 has a frequency characteristic shown in FIG. 29B, which has the same tendency as that of the reactance $X_5$ of the first reactance circuit 50 shown in FIG. 21. This is obtained by combining the frequency characteristics shown in FIGS. 28B and 24B.

In an impedance-matching circuit according to a seventh embodiment of the invention, the reactance circuit 76 of FIG. 29A is used as the first and second reactance circuits. The other configuration is the same as that of the third embodiment.

Eighth Embodiment

Figure 30A:
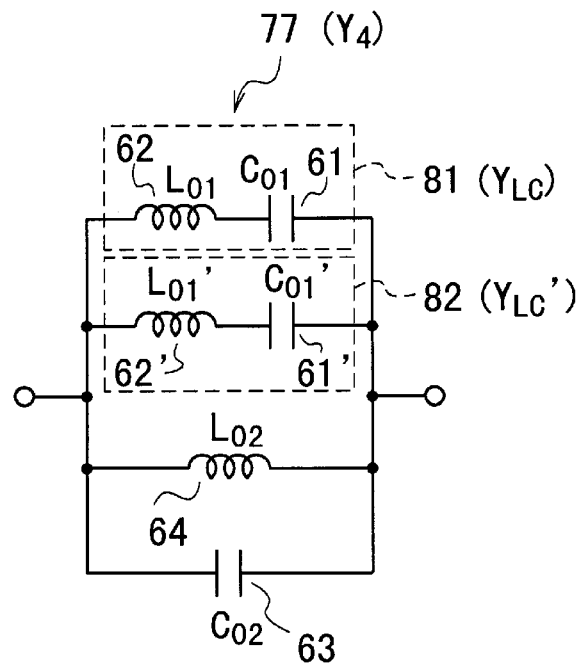
FIG. 30A is a circuit diagram of a reactance circuit used in an impedance-matching circuit according to an eighth embodiment of the present invention, where the reactance circuit consists of two parallel-connected series resonant circuits each formed by an inductor and a capacitor connected in series, and an inductor and a capacitor both connected in parallel to the two series resonant circuits.

FIG. 30A shows a reactance circuit 77 consisting of the series resonant circuit 81, a series resonant circuit 82, the capacitor 63, and the inductor 64, which are connected in parallel. The series resonant circuit 82 is formed by a capacitor having a capacitance $C_{01}'$ and an inductor having an inductance $L_{01}'$.

Figure 30B:
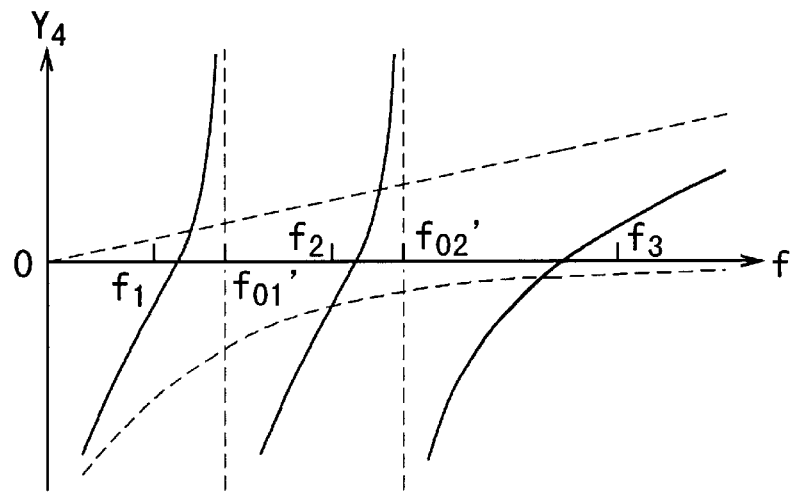
FIG. 30B is a graph showing schematically the frequency characteristic of the admittance of the reactance circuit shown in FIG. 30A.

The admittance $Y_4$ of the reactance circuit 77 has a frequency characteristic shown in FIG. 30B, which has the same tendency as that of the reactance $X_5'$ of the first reactance circuit 50A shown in FIG. 23. This is obtained by combining the frequency characteristics shown in FIGS. 29B and 27B. The reference symbols $f_{01}'$ and $f_{02}'$ denote the resonant frequencies of the series resonant circuits 81 and 82, respectively.

In an impedance-matching circuit according to an eighth embodiment of the invention, the reactance circuit 77 of FIG. 30A is used as the first and second reactance circuits. The other configuration is the same as that of the fourth embodiment.

APPLICATION EXAMPLES

Figure 31:
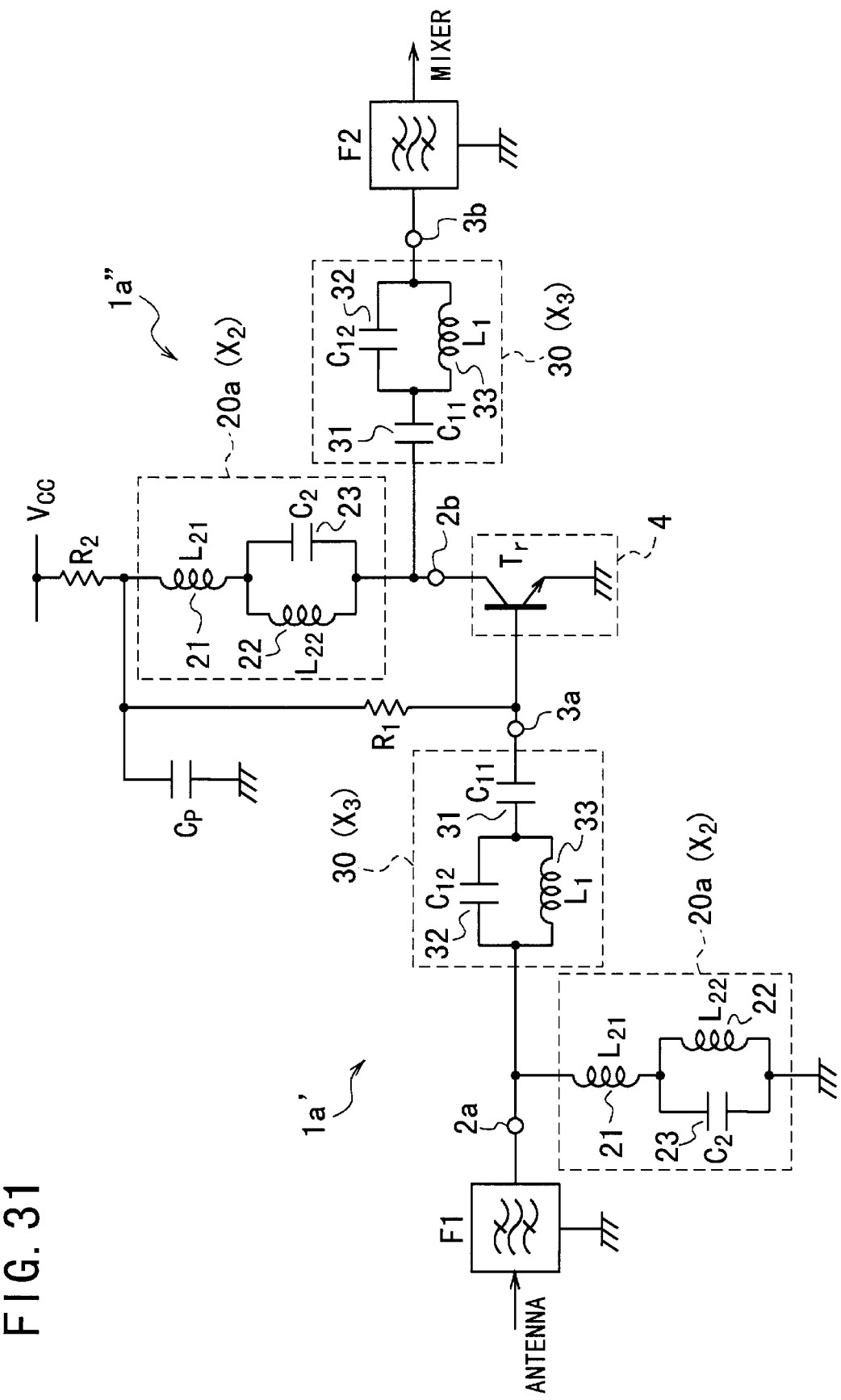
FIG. 31 is a circuit diagram showing the circuit configuration of a receiver of a radio communication system, in which the impedance-matching circuit according to the present invention is used.

FIG. 31 shows the circuit configuration of a receiver of a radio communication system, in which the impedance-matching circuit according to the present invention is used.

An impedance-matching circuit 1a' is provided between a filter F1 connected to an input terminal 2a of the circuit 1a' and a transistor Tr of a RF circuit 4 connected to an output terminal 3a of the circuit 1a'. Another impedance-matching circuit 1a" is provided between the transistor Tr of the RF circuit 4 connected to an input terminal 2b of the circuit 1a" and a filter F2 connected to an output terminal 3b of the circuit 1a". Each of the impedance-matching circuits 1a' and 1a" is comprised of the second reactance circuit 20a according to the first embodiment and the first reactance circuit 30 according to the second embodiment. In FIG. 31, $R_1$ and $R_2$ are resistors and $C_P$ is a capacitor.

Figure 3:
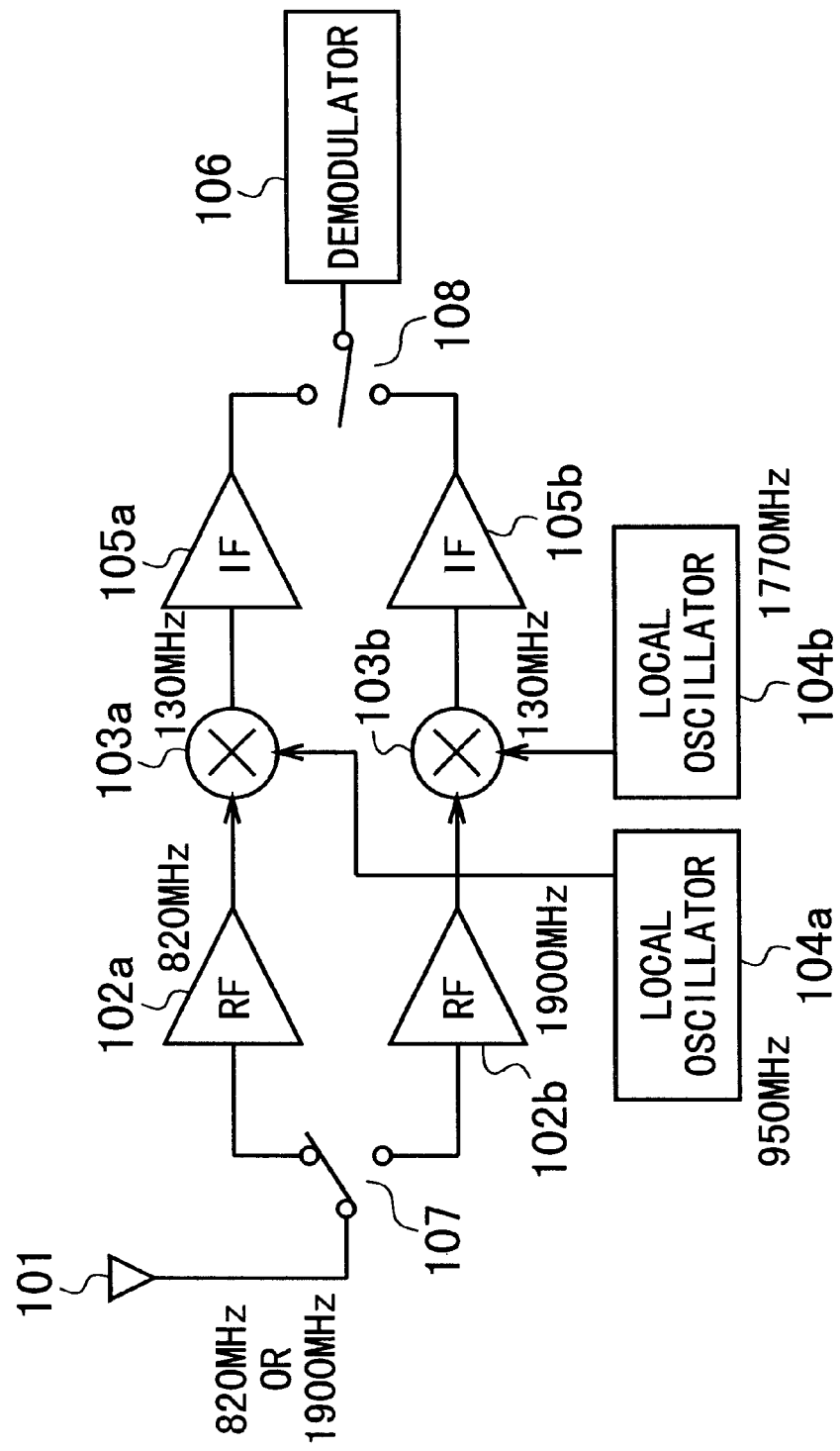
FIG. 3 is a block diagram showing the circuit configuration of a conventional two-band telephone.
Figure 4:
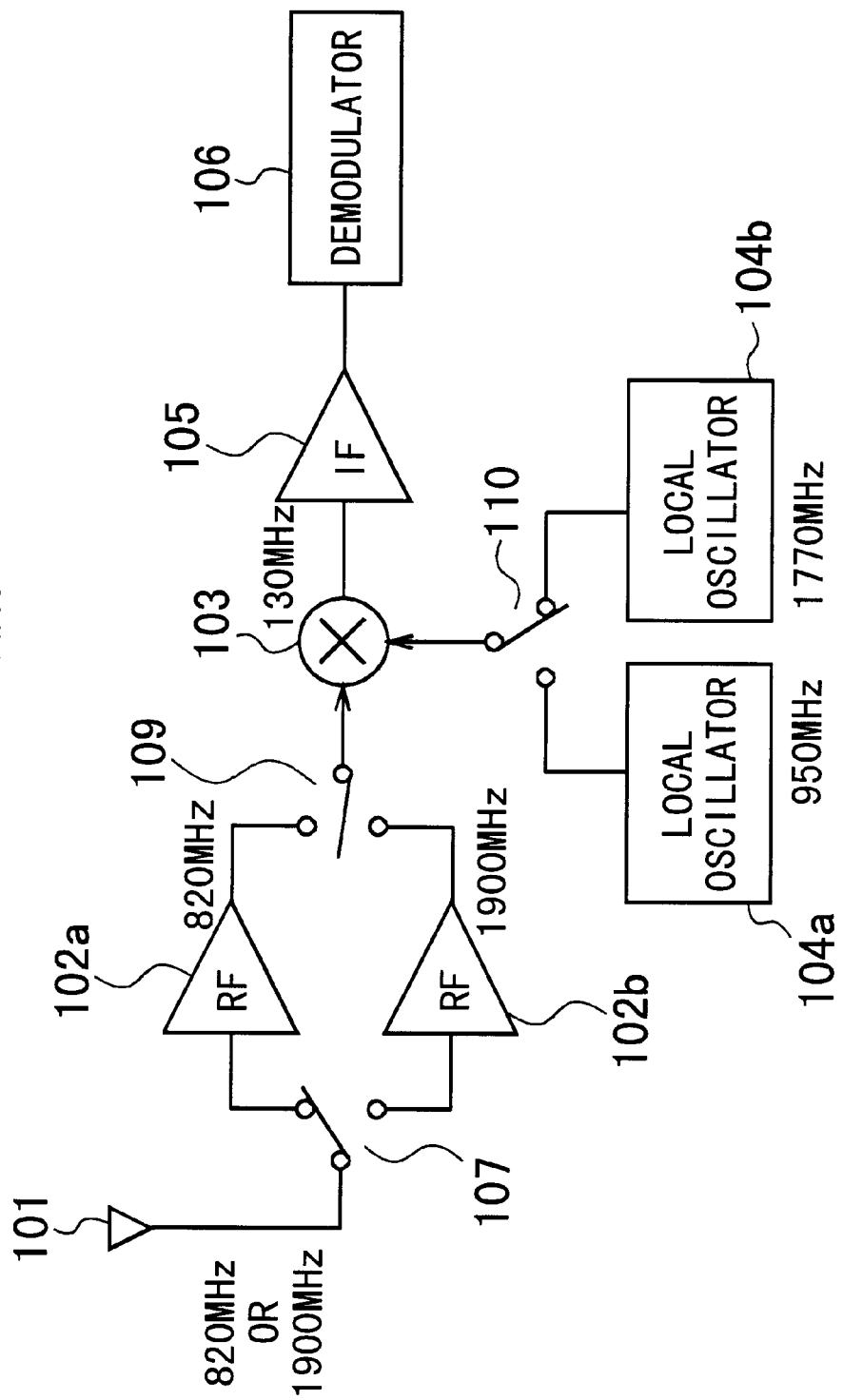
FIG. 4 is a block diagram showing the circuit configuration of another conventional two-band telephone.
Figure 5:
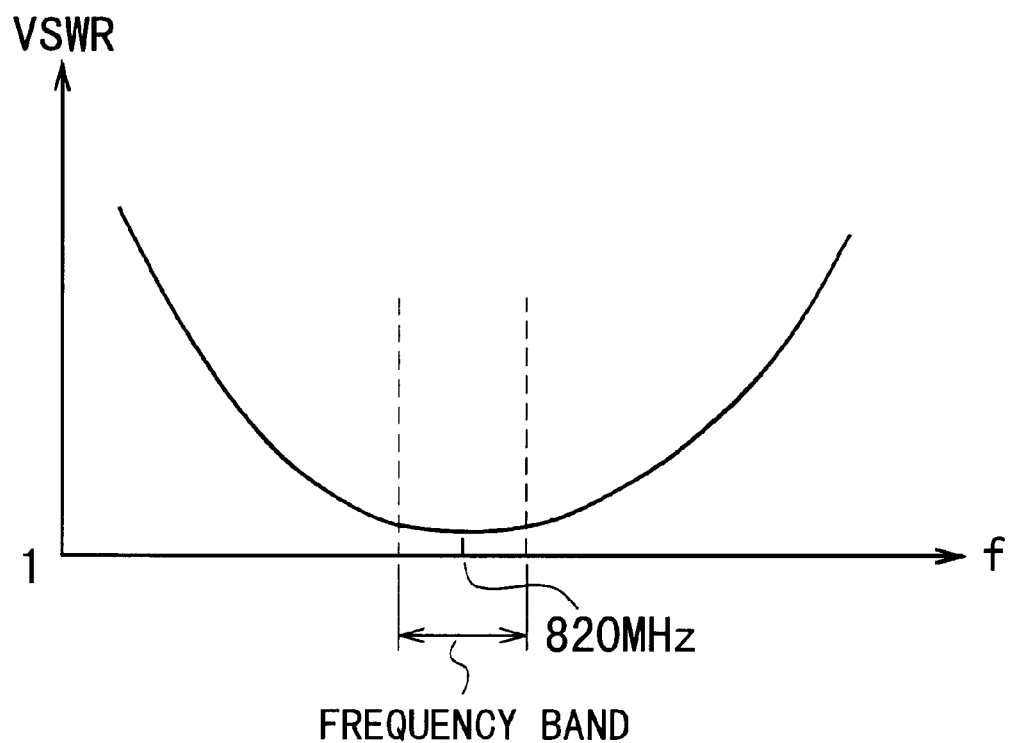
FIG. 5 is a graph showing schematically the VSWR-f characteristic of the conventional single-band receiver of FIG. 2
Figure 6A:
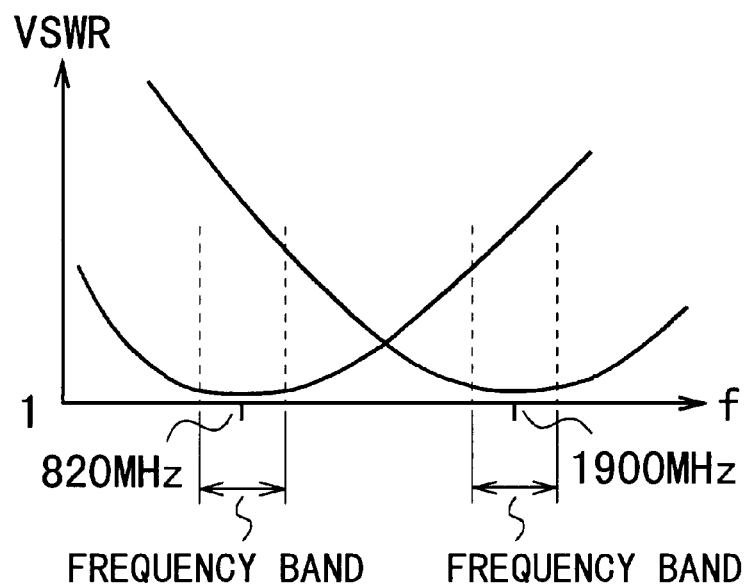
FIG. 6A is a graph showing schematically the VSWR-f characteristic of the conventional two-band telephone of FIG. 3.
Figure 6B:
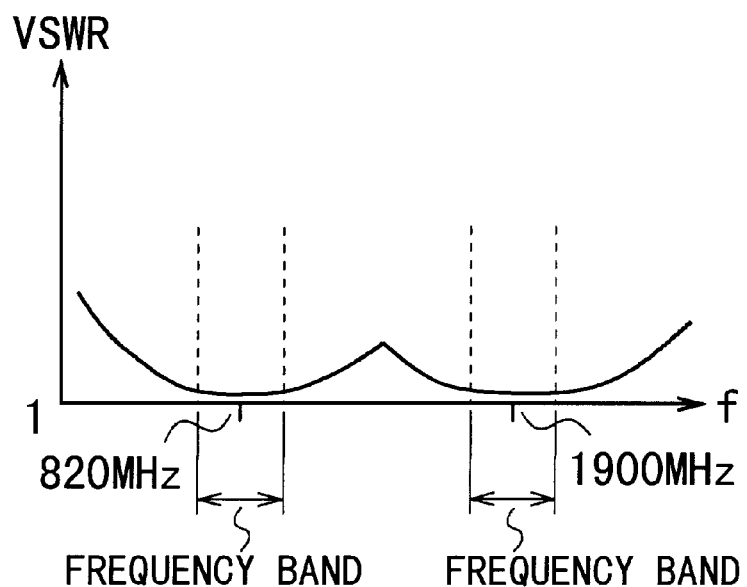
FIG. 6B is a graph showing schematically the VSWR-f characteristic of the conventional two-band telephone of FIG. 4.
Figure 32:
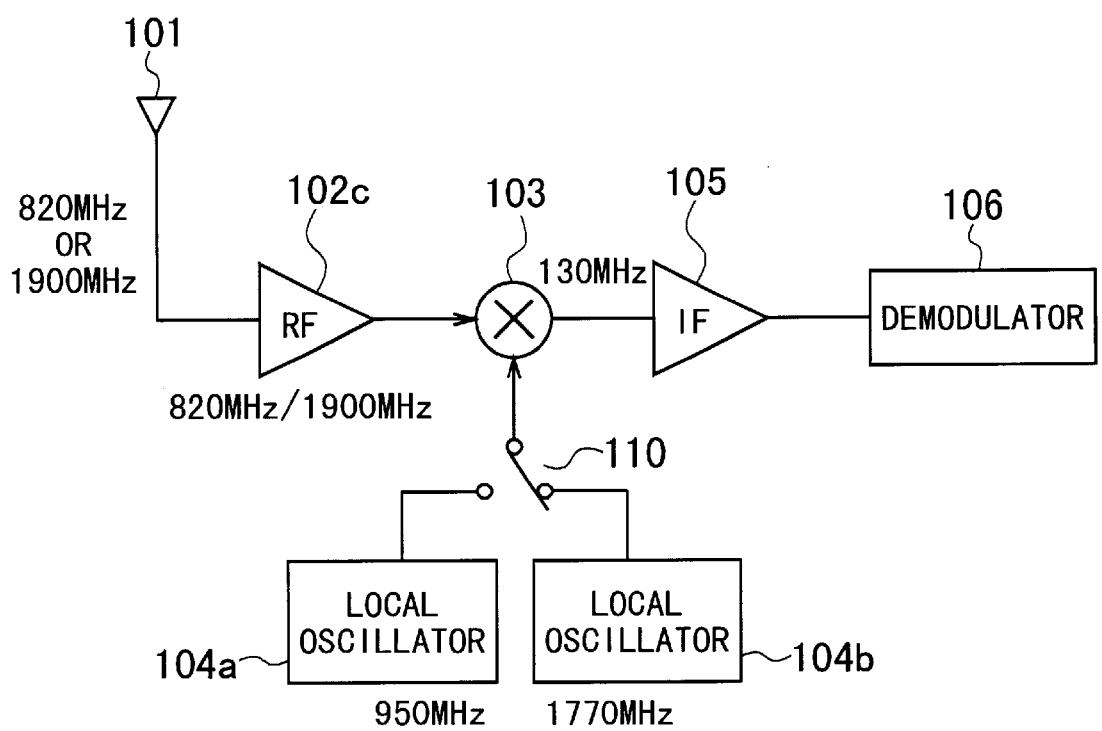
FIG. 32 is a block diagram showing the circuit configuration of a two-band telephone, in which the impedance-matching circuit according to the present invention is applied to the conventional circuit shown in FIGS. 3 or 4.

FIG. 32 shows the circuit configuration of a two-band telephone, in which the impedance-matching circuit according to the present invention is applied to the conventional circuit shown in FIG. 3 or 4. In FIG. 32, a common RF amplifier 102c is provided for the received signals in the 820 MHz and 1900 MHz bands of frequencies. The other configuration is the same as that of FIG. 4. The common RF amplifier 102c has the VSWR-f characteristic shown in FIG. 6B.

VARIATIONS

Figure 33A:
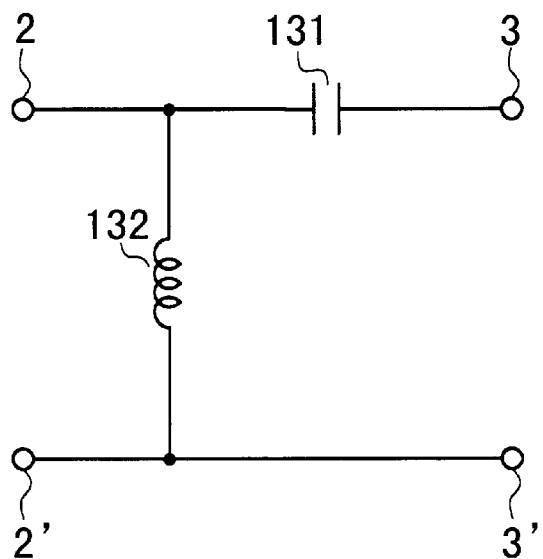
FIG. 33A is a circuit diagram of a conventional impedance-matching circuit with the "L-C matching" configuration.
Figure 33B:
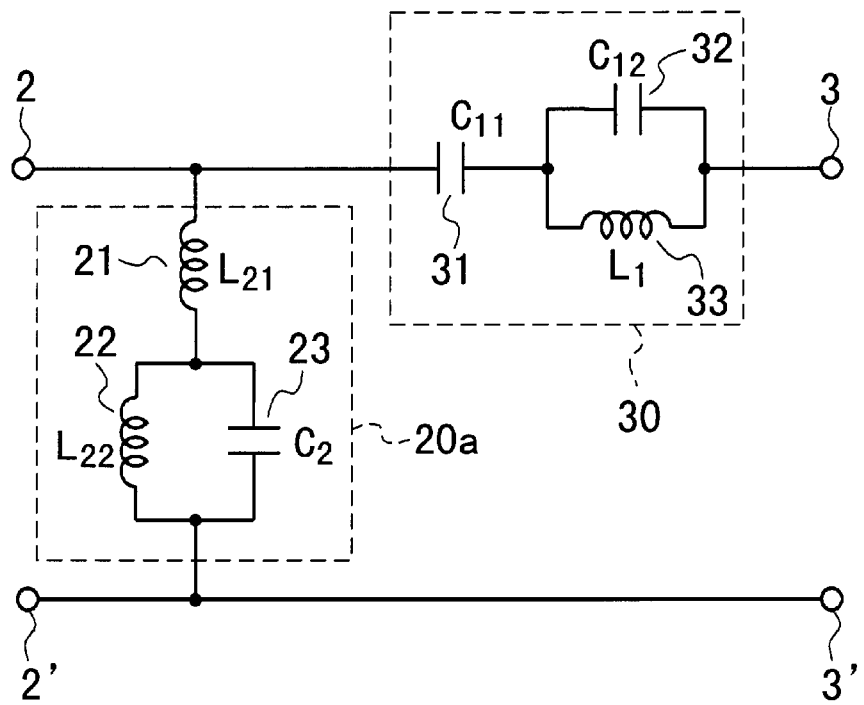
FIG. 33B is a circuit diagram of an impedance-matching circuit according to a variation of the present invention having the "L-C matching" configuration.
Figure 34A:
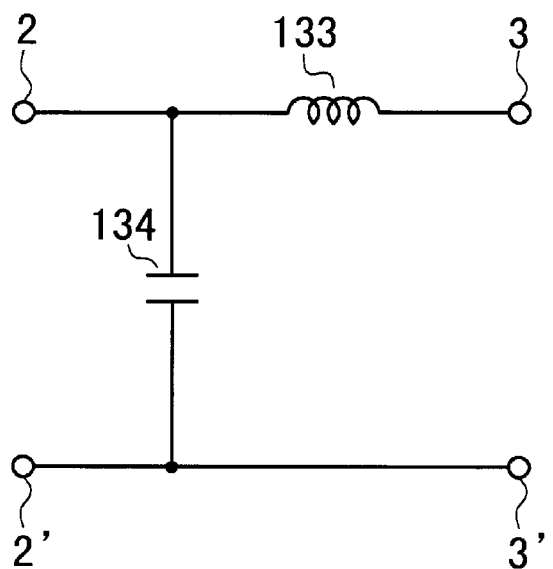
FIG. 34A is a circuit diagram of a conventional impedance-matching circuit with the "C-L matching" configuration.
Figure 34B:
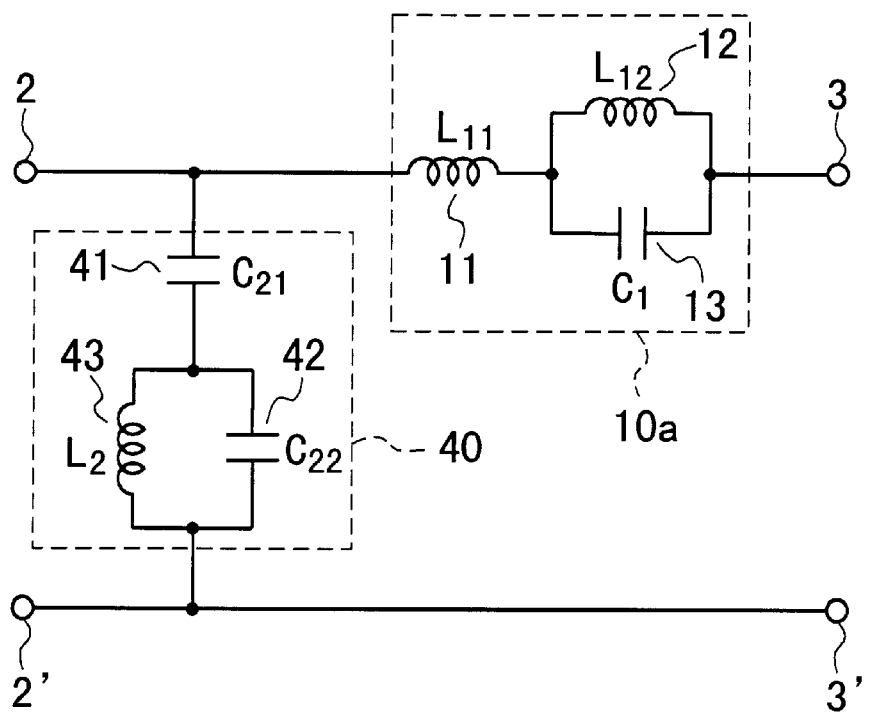
FIG. 34B is a circuit diagram of an impedance-matching circuit according to a variation of the present invention having the "C-L matching" configuration.

FIGS. 33B and 34B show variations of the impedance-matching circuit according to the present invention.

As described previously, the first embodiment has the "L—L matching" configuration and the second embodiment has the "C—C matching" configuration. However, the present invention is not limited thereto.

FIG. 33A shows a conventional impedance-matching circuit with the "L-C matching" configuration, which comprises an inductor 132 connected to the terminals 2 and 2' and a capacitor 131 connected to the terminal 2 and 3. For example, the structure of an impedance-matching circuit according to the present invention having the same "L-C matching" configuration is shown in FIG. 33B. The reference symbols in FIG. 34B are the same as used in the first and second embodiments.

FIG. 34A shows a conventional impedance-matching circuit with the "C-L matching" configuration, which comprises a capacitor 134 connected to the terminals 2 and 2' and an inductor 133 connected to the terminal 2 and 3. For example, the structure of an impedance-matching circuit according to the present invention having the same "C-L matching" configuration is shown in FIG. 34B. The reference symbols in FIG. 34B are the same as used in the first and second embodiments.

FIGS. 35 to 40 show variations of the basic configuration of the impedance-matching circuit according to the present invention between the input terminals 2 and 2' and the output terminals 3 and 3'.

Figure 35:
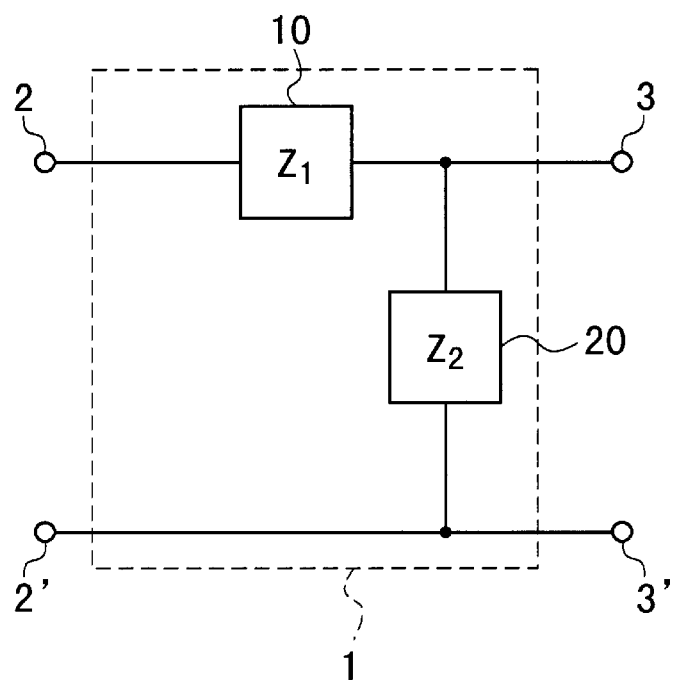
FIG. 35 is a block diagram showing a basic configuration of an impedance-matching circuit according to a variation of the present invention, in which two impedance circuits are provided.

In FIG. 35, two terminals of the first impedance circuit 10 are connected to the input terminal 2 and the output terminal 3, and two terminals of the impedance circuit 20 are connected across the output terminals 3 and 3'.

Figure 36:
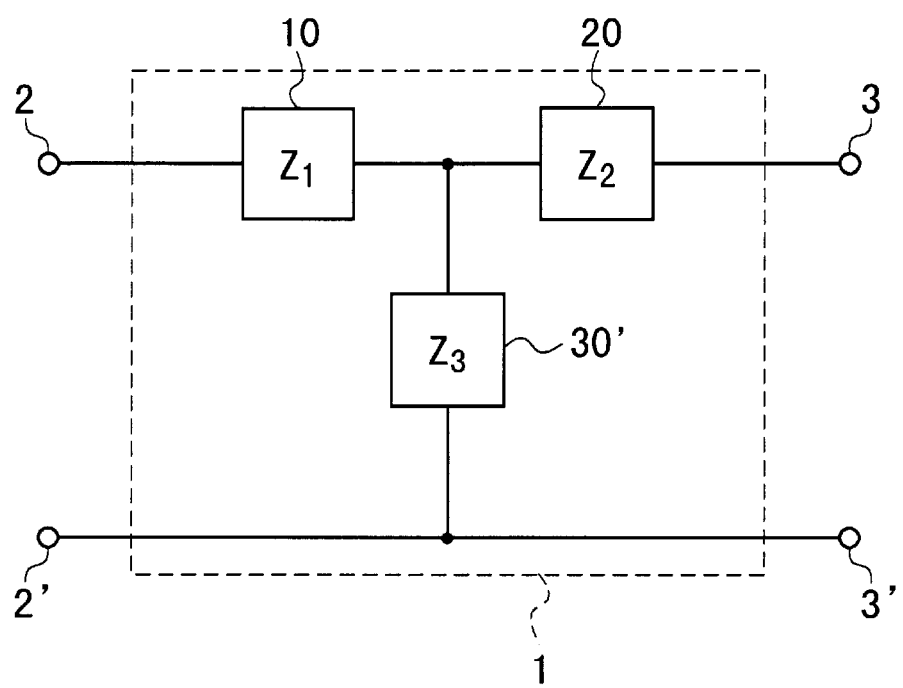
FIG. 36 is a block diagram showing a basic configuration of an impedance-matching circuit according to a variation of the present invention, in which three impedance circuits are provided.

In FIG. 36, the first and second impedance circuits 10 and 20 are connected in series between the input terminal 2 and the output terminal 3. One terminal of a third impedance circuit 30' is connected to the connection points of the first and second impedance circuits 10 and 20 and the other terminal is commonly connected to the input and output terminals 2' and 3'.

Figure 37:
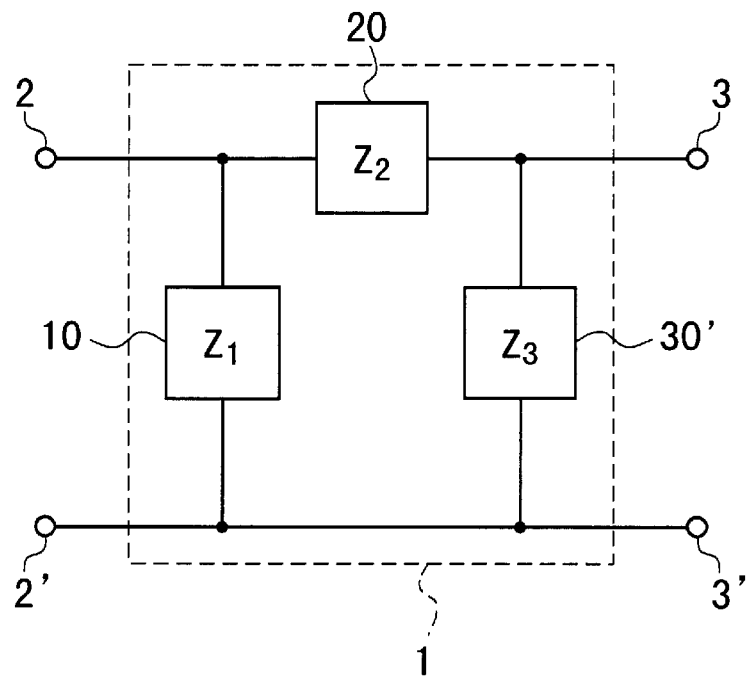
FIG. 37 is a block diagram showing a basic configuration of an impedance-matching circuit according to a variation of the present invention, in which three impedance circuits are provided.

In FIG. 37, two terminals of the first impedance circuit 10 are connected across the input terminals 2 and 2', two terminals of the second impedance circuit 20 are connected to the input and output terminals 2 and 3, and two terminals of the third impedance circuit 30' are connected across the output terminals 3 and 3'.

Figure 38:
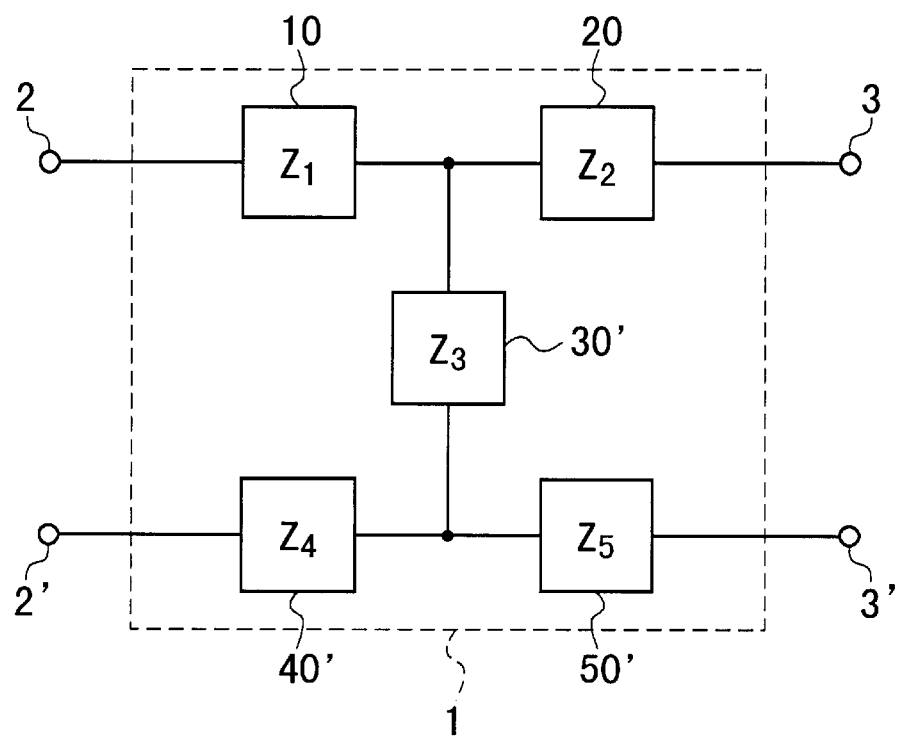
FIG. 38 is a block diagram showing a basic configuration of an impedance-matching circuit according to a variation of the present invention, in which five impedance circuits are provided.

In FIG. 38, the first and second impedance circuits 10 and 20 are connected in series between the input terminal 2 and the output terminal 3. Fourth and fifth impedance circuits 40' and 50' are connected in series between the input terminal 2' and the output terminal 3'. One terminal of a third impedance circuit 30' is connected to the connection point of the first and second impedance circuits 10 and 20 and the other terminal is connected to the connection point of the fourth and fifth impedance circuits 40' and 50'.

Figure 39:
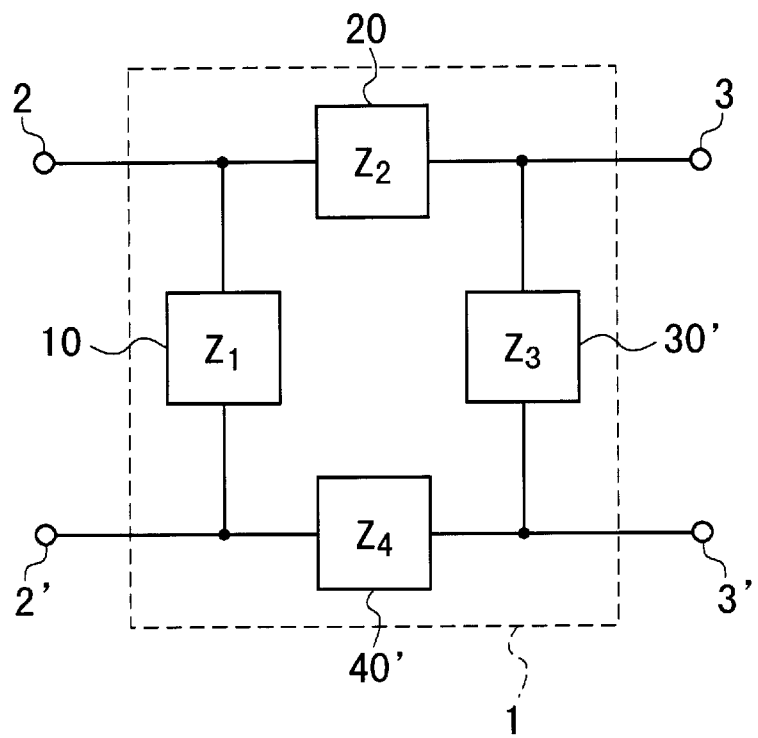
FIG. 39 is a block diagram showing a basic configuration of an impedance-matching circuit according to a variation of the present invention, in which four impedance circuits are provided.

In FIG. 39, two terminals of the first impedance circuit 10 are connected across the input terminals 2 and 2', two terminals of the second impedance circuit 20 are connected to the input and output terminals 2 and 3, two terminals of the third impedance circuit 30' are connected across the output terminals 3 and 3', and two terminals of the fourth impedance circuit 40' are connected to the input and output terminals 2' and 3'.

Figure 40:
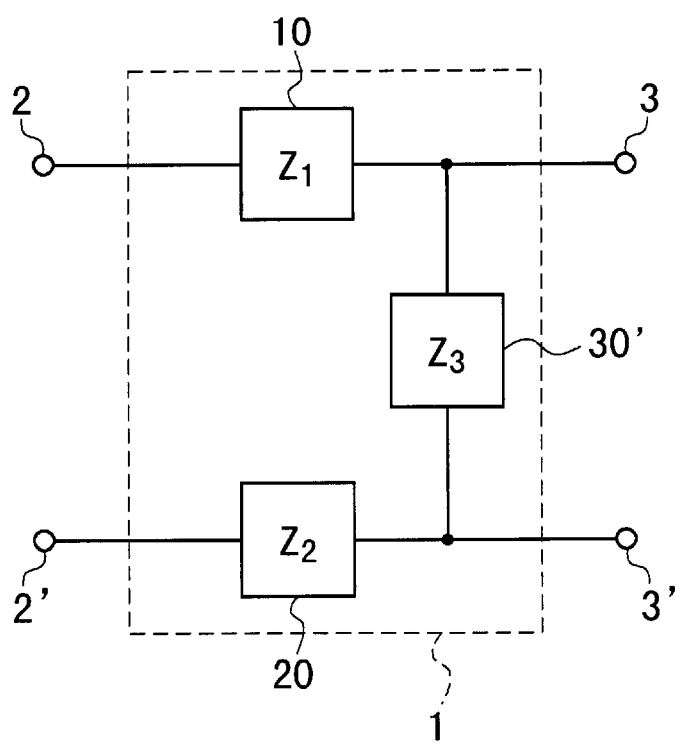
FIG. 40 is a block diagram showing a basic configuration of an impedance-matching circuit according to a variation of the present invention, in which three impedance circuits are provided.

In FIG. 40, two terminals of the first impedance circuit 10 are connected to the input and output terminals 2 and 3, two terminals of the second impedance circuit 20 are connected to the input terminals 2' and 3', and two terminals of the third impedance circuit 30' are connected across the output terminals 3 and 3'.

As each of the first to fifth impedance circuit 10, 20, 30', 40', and 50', the configuration of the impedance-matching circuit according to the present invention may be used.

The present invention may be applied any other types of the basic configuration than those shown in FIGS. 35 to 40.

In the above-described first to fourth embodiments, the input impedance of the RF circuit is matched to the output impedance (=50 Ω) of the RF circuit. However, the present invention is not limited to these cases.

Moreover, in the above-described first to eighth embodiments, the present invention is applied to a receiver built in a portable phone. However, it is needless to say that the present invention is not limited to the case. For example, the present invention may be applied to a transmitter built in a portable phone, and any electronic circuit necessitating impedance matching.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An impedance-matching method for matching impedances of first and second circuits at two or more frequencies by using an impedance-matching circuit including reactance elements, the method comprising:

a first step of configuring reactance circuits equivalent to said individual reactance elements of said impedance-matching circuit, each of said reactance circuits comprising reactance elements and having a frequency characteristic giving desired reactance values at said two or more frequencies;

a second step of calculating reactance values of said reactance elements forming each of said reactance circuits configured in said first step; and a third step of determining impedance values of said impedance-matching circuit at said two or more frequencies by using said reactance circuits having said calculated reactance values in said second step, said impedance values completely matching the impedances of said first and second circuits at said two or more frequencies.

2. The method as claimed in claim 1, wherein each of said reactance circuits configured in said first step comprises a resonant circuit having a resonant frequency located between two adjacent ones of said frequencies.

3. The method as claimed in claim 1, wherein each of said resonant circuit is a parallel resonant circuit formed by reactance elements.

4. The method as claimed in claim 1, wherein each of said resonant circuit is a parallel resonant circuit formed by an inductive reactance element and a capacitive reactance element connected in parallel.

5. The method as claimed in claim 1, wherein each of said resonant circuit is a series resonant circuit formed by reactance elements.

6. The method as claimed in claim 1, wherein each of said resonant circuit is a series resonant circuit formed by an inductive reactance element and a capacitive reactance element connected in series.

7. The method as claimed in claim 1, wherein said calculation of said reactance values of said reactance elements in said second step is performed using a Smith or admittance chart on which a target point corresponding to the impedance value of said second circuit at one of said frequencies is located a center of said chart;

and wherein said second step includes;

a first substep of defining initial points corresponding to the impedance values of said first circuit at said respective frequencies on said chart;

a second substep of moving said initial points defined on said chart to corresponding temporary points on a circular circumference passing through the center of said chart; and a third substep of moving said temporary points located on said circular circumference to overlap with the center of said chart.

8. An impedance-matching circuit used for matching impedances of first and second circuits at two or more frequencies, comprising:

a first terminal pair across which said first circuit is connected;

a second terminal pair across which said second circuit is connected;

impedance circuits provided between said first terminal pair and said second terminal pair;

each of said impedance circuits including a reactance circuit with a frequency characteristic giving desired reactance values at said two or more frequencies;

impedance values of each of said impedance circuits at said frequencies being determined by said corresponding reactance circuit; and total impedance values of said impedance circuits at said frequencies being defined to completely match the impedances of said first and second circuits at said frequencies.

9. The circuit as claimed in claim 8, wherein each of said reactance circuits comprises a resonant circuit having a resonant frequency located between two adjacent ones of said frequencies.

10. The circuit as claimed in claim 9, wherein each of said resonant circuits is a parallel resonant circuit formed by reactance elements.

11. The circuit as claimed in claim 10, wherein each of said parallel resonant circuit includes an inductive reactance element and a capacitive reactance element connected in parallel.

12. The circuit as claimed in claim 10, wherein each of said parallel resonant circuit includes an inductive reactance element and a capacitive reactance element connected in parallel;

and wherein at least one of an inductive reactance element and a capacitive reactance element is further connected in series to said parallel resonant circuit in each of said reactance circuits.

13. The circuit as claimed in claim 8, wherein each of said reactance circuits comprises resonant circuits connected in series;

and wherein each of said resonant circuits has a resonant frequency located between two adjacent ones of said frequencies.

14. The circuit as claimed in claim 13, wherein each of said resonant circuits is a parallel resonant circuit formed by an inductive reactance element and a capacitive reactance element connected in parallel.

15. The circuit as claimed in claim 13, wherein each of said resonant circuits is a parallel resonant circuit formed by an inductive reactance element and a capacitive reactance element connected in parallel;

and wherein at least one of an inductive reactance element and a capacitive reactance element is further connected in series to said parallel resonant circuits in each of said reactance circuits.

16. The circuit as claimed in claim 9, wherein each of said resonant circuits is a series resonant circuit formed by reactance elements.

17. The circuit as claimed in claim 16, wherein each of said series resonant circuit includes an inductive reactance element and a capacitive reactance element connected in series.

18. The circuit as claimed in claim 16, wherein each of said series resonant circuit includes an inductive reactance element and a capacitive reactance element connected in series;

and wherein at least one of an inductive reactance element and a capacitive reactance element is further connected in parallel to said series resonant circuit in each of said reactance circuits.

19. The circuit as claimed in claim 8, wherein each of said reactance circuits comprises resonant circuits connected in parallel;

and wherein each of said resonant circuits has a resonant frequency located between two adjacent ones of said frequencies.

20. The circuit as claimed in claim 19, wherein each of said resonant circuits is a series resonant circuit formed by an inductive reactance element and a capacitive reactance element connected in series.

21. The circuit as claimed in claim 19, wherein each of said resonant circuits is a series resonant circuit formed by an inductive reactance element and a capacitive reactance element connected in series;

and wherein at least one of an inductive reactance element and a capacitive reactance element is further connected in parallel to said series resonant circuits in each of said reactance circuits.

22. The circuit as claimed in claim 8, wherein a first one of said impedance circuits is connected to one terminal of said first terminal pair and one terminal of said second terminal pair; and a second one of said impedance circuits is connected across said first or second terminal pair.

23. The circuit as claimed in claim 8, wherein a first one of said impedance circuits is connected to one terminal of said first terminal pair and one terminal of said second terminal pair; and second and third ones of said impedance circuits are respectively connected across said first and second terminal pairs.

24. The circuit as claimed in claim 8, wherein a first one of said impedance circuits is connected to one terminal of said first terminal pair and one terminal of said second terminal pair; a second one of said impedance circuits is connected to the other terminal of said first terminal pair and the other terminal of said second terminal pair; and a third one of said impedance circuits is connected across said first or second terminal pair.

25. The circuit as claimed in claim 8, wherein a first one of said impedance circuits is connected to one terminal of said first terminal pair and one terminal of said second terminal pair; a second one of said impedance circuits is connected to the other terminal of said first terminal pair and the other terminal of said second terminal pair; and third and fourth ones of said impedance circuits are respectively connected across said first and second terminal pairs.

26. The circuit as claimed in claim 8, wherein first and second ones of said impedance circuits are connected in series between one terminal of said first terminal pair and one terminal of said second terminal pair; and a third one of said impedance circuits is connected to said connection point of said first and second ones of said impedance circuits and the other terminals of said first and second terminal pairs.

27. The circuit as claimed in claim 8, wherein first and second ones of said impedance circuits are connected in series between one terminal of said first terminal pair and one terminal of said second terminal pair; third and fourth ones of said impedance circuits are connected in series between the other terminal of said first terminal pair and the other terminal of said second terminal pair; and a fifth one of said impedance circuits is connected to said connection point of said first and second ones of said impedance circuits and that of said third and fourth ones of said impedance circuits.

28. An impedance-matching circuit for matching an output impedance of a first circuit with an input impedance of a second circuit where said first and second circuits operate at first and second frequencies, comprising:

a first impedance circuit including a first reactance circuit, said first reactance circuit having a frequency characteristic which yields first reactance;

a second impedance circuit including a second reactance circuit, said second reactance circuit having a frequency characteristic which yields a second reactance;

wherein values of said first reactance and said second reactance are set so that the first impedance circuit and the second impedance circuit, taken in combination, completely match the output impedance of said first circuit with the input impedance of said second circuit at both said first and second frequencies.

29. An impedance-matching circuit as claimed in claim 28, wherein said first reactance circuit includes a first reactance element and a first resonant circuit, said first resonant circuit having a resonant frequency that lies between said first and second frequencies, and wherein said second reactance circuit includes a second reactance element and a second resonant circuit, said second resonant circuit having a resonant frequency that lies between said first and second frequencies.

30. An impedance-matching circuit as claimed in claim 29, wherein said values of said first reactance of said first reactance circuit are set so that the first impedance circuit and said second impedance circuit, when taken together, produce a same admittance at said first and second frequencies, and wherein values of said second reactance of said second reactance circuit are set so that the first impedance circuit and said second impedance circuit, when taken together, maintain said same admittance at said first and second frequencies but reduce a total reactance to zero.

31. A method for matching an output impedance of a first circuit with an input impedance of a second circuit, where said first and second circuits operate at first and second frequencies, comprising:

provuring a first impedance circuit between said first circuit and said second circuit, said first impedance circuit including a first reactance circuit that includes a first reactance element and a first resonant circuit, said first resonant circuit having a resonant frequency that lies between said first and second frequencies;

providing a second impedance circuit between said first circuit and said second circuit, said second impedance circuit including a second reactance circuit that includes a second reactance element and a second resonant circuit, said second resonant circuit having a resonant frequency that lies between said first and second frequencies;

setting reactance values of said first reactance circuit so that the first impedance circuit and said second impedance circuit, when taken together, produce a same admittance at said first and second frequencies; and setting reactance values of said second reactance circuit so that the first impedance circuit and said second impedance circuit, when taken together, maintain said same admittance at said first and second frequencies but reduce a total reactance to zero.

32. A method for matching an output impedance of a first circuit with an input impedance of a second circuit, where said first and second circuits operate at first and second frequencies, comprising:

providing a first impedance circuit between said first circuit and said second circuit, said first impedance circuit including a first reactance circuit having a frequency characteristic which yields a first reactance;

providing a second impedance circuit between said first circuit and said second circuit, said second impedance circuit including a second reactance circuit having a frequency characteristic which yields a second reactance; and setting said values of said first reactance and said second reactance so that the first impedance circuit and the second impedance circuit, taken in combination, completely match the output impedance of said first circuit with the input impedance of said second circuit at both said first and second frequencies.

33. A method as claimed in claim 32, wherein said first reactance circuit includes a first reactance element and a first resonant circuit, said first resonant circuit having a resonant frequency that lies between said first and second frequencies, and wherein said second reactance circuit includes a second reactance element and a second resonant circuit, said second resonant circuit having a resonant frequency that lies between said first and second frequencies, said setting step including:

setting said values of said first reactance of said first reactance circuit so that the first impedance circuit and said second impedance circuit, when taken together, produce a same admittance at said first and second frequencies; and setting values of said second reactance of said second reactance circuit so that the first impedance circuit and said second impedance circuit, when taken together, maintain said same admittance at said first and second frequencies but reduce a total reactance to zero.

* * * * *